(12) United States Patent
Okamoto et al.

(10) Patent No.: US 11,908,876 B2
(45) Date of Patent: Feb. 20, 2024

(54) SEMICONDUCTOR DEVICE INCLUDING PHOTOELECTRIC CONVERSION ELEMENT

(71) Applicant: Semiconductor Energy Laboratory Co., Ltd., Atsugi (JP)

(72) Inventors: Yuki Okamoto, Sagamihara (JP); Yoshiyuki Kurokawa, Sagamihara (JP); Hiroki Inoue, Atsugi (JP); Takuro Ohmaru, Zama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/517,705

(22) Filed: Nov. 3, 2021

(65) Prior Publication Data

US 2022/0077205 A1 Mar. 10, 2022

Related U.S. Application Data

(63) Continuation of application No. 15/311,261, filed as application No. PCT/IB2015/053951 on May 27, 2015, now Pat. No. 11,205,669.

(30) Foreign Application Priority Data

Jun. 9, 2014 (JP) .................................. 2014-118773

(51) Int. Cl.
*H01L 27/146* (2006.01)
*H01L 21/8234* (2006.01)
(Continued)

(52) U.S. Cl.
CPC .... *H01L 27/14603* (2013.01); *H01L 21/8234* (2013.01); *H01L 27/088* (2013.01);
(Continued)

(58) Field of Classification Search
CPC ........... H01L 27/14603; H01L 27/1461; H01L 27/14616; H01L 27/1463; H01L 27/14643;
(Continued)

(56) References Cited

U.S. PATENT DOCUMENTS

| | | | |
|---|---|---|---|
| 7,046,282 B1 | 5/2006 | Zhang et al. | |
| 7,557,846 B2 | 7/2009 | Ohkawa | |

(Continued)

FOREIGN PATENT DOCUMENTS

| | | | |
|---|---|---|---|
| CN | 101271934 A | 9/2008 | |
| CN | 101669217 A | 3/2010 | |

(Continued)

OTHER PUBLICATIONS

JP-2009105358-A Machine Translation (Year: 2009).*

(Continued)

*Primary Examiner* — David Chen
(74) *Attorney, Agent, or Firm* — Eric J. Robinson; Robinson Intellectual Property Law Office, P.C.

(57) ABSTRACT

A solid-state imaging device with high productivity and improved dynamic range is provided. In the imaging device including a photoelectric conversion element having an i-type semiconductor layer, functional elements, and a wiring, an area where the functional elements and the wiring overlap with the i-type semiconductor in a plane view is preferably less than or equal to 35%, further preferably less than or equal to 15%, and still further preferably less than or equal to 10% of the area of the i-type semiconductor in a plane view. Plural photoelectric conversion elements are provided in the same semiconductor layer, whereby a process for separating the respective photoelectric conversion elements can be reduced. The respective i-type semiconductor layers in the plural photoelectric conversion elements are (Continued)

separated by a p-type semiconductor layer or an n-type semiconductor layer.

4 Claims, 24 Drawing Sheets

(51) Int. Cl.
*H01L 27/088* (2006.01)
*H01L 27/12* (2006.01)
*H04N 23/54* (2023.01)
*H01L 29/786* (2006.01)
*H01L 31/075* (2012.01)
*H01L 23/528* (2006.01)

(52) U.S. Cl.
CPC ...... *H01L 27/1225* (2013.01); *H01L 27/1255* (2013.01); *H01L 27/146* (2013.01); *H01L 27/1461* (2013.01); *H01L 27/1463* (2013.01); *H01L 27/14609* (2013.01); *H01L 27/14612* (2013.01); *H01L 27/14616* (2013.01); *H01L 27/14643* (2013.01); *H01L 27/14692* (2013.01); *H01L 29/7869* (2013.01); *H01L 31/075* (2013.01); *H04N 23/54* (2023.01); *H01L 23/5286* (2013.01)

(58) Field of Classification Search
CPC ........... H01L 27/14692; H01L 29/7869; H01L 31/075; H01L 27/02; H01L 23/5286
USPC .............. 257/258, 355, 360, 23.153, 27.131; 438/112
See application file for complete search history.

(56) References Cited

U.S. PATENT DOCUMENTS

| | | | |
|---|---|---|---|
| 8,039,917 B2 | 10/2011 | Miura | |
| 8,134,625 B2 | 3/2012 | Abe et al. | |
| 8,174,047 B2 | 5/2012 | Fukuoka et al. | |
| 8,227,887 B2 | 7/2012 | Brown et al. | |
| 8,350,937 B2 | 1/2013 | Rennie | |
| 8,363,365 B2 | 1/2013 | Fukuoka et al. | |
| 8,378,391 B2 | 2/2013 | Koyama et al. | |
| 8,605,059 B2 | 12/2013 | Kurokawa et al. | |
| 8,610,696 B2 | 12/2013 | Kurokawa | |
| 8,654,231 B2 | 2/2014 | Kurokawa et al. | |
| 8,698,782 B2 | 4/2014 | Kurokawa | |
| 8,716,712 B2 | 5/2014 | Kozuma et al. | |
| 8,772,701 B2 | 7/2014 | Kurokawa et al. | |
| 8,791,538 B2 | 7/2014 | Yamamoto et al. | |
| 8,803,164 B2 | 8/2014 | Kurokawa et al. | |
| 8,817,152 B2 | 8/2014 | Abe et al. | |
| 8,836,626 B2 | 9/2014 | Ikeda | |
| 8,860,081 B2 | 10/2014 | Fukuoka et al. | |
| 8,872,120 B2 | 10/2014 | Kurokawa et al. | |
| 8,928,053 B2 | 1/2015 | Kurokawa | |
| 8,952,313 B2 | 2/2015 | Tamura | |
| 8,964,085 B2 | 2/2015 | Kurokawa et al. | |
| 8,976,155 B2 | 3/2015 | Kurokawa et al. | |
| 8,987,651 B2 | 3/2015 | Kurokawa | |
| 9,006,635 B2 | 4/2015 | Kurokawa et al. | |
| 9,035,301 B2 | 5/2015 | Takahashi et al. | |
| 9,121,893 B2 | 9/2015 | Schmand et al. | |
| 9,153,619 B2 | 10/2015 | Kurokawa et al. | |
| 9,184,190 B2 | 11/2015 | Sato et al. | |
| 9,257,567 B2 | 2/2016 | Kurokawa et al. | |
| 9,357,143 B2 | 5/2016 | Yamada | |
| 9,385,155 B2 | 7/2016 | Yamamoto et al. | |
| 9,450,133 B2 | 9/2016 | Nakamura et al. | |
| 9,490,373 B2 | 11/2016 | Sakano et al. | |
| 10,036,790 B2 | 7/2018 | Schmand et al. | |
| 10,192,923 B2 | 1/2019 | Yamamoto et al. | |
| 10,224,361 B2 | 3/2019 | Yamamoto et al. | |
| 2007/0069258 A1 | 3/2007 | Ahn | |
| 2008/0296642 A1 | 12/2008 | Miura | |
| 2009/0261444 A1 | 10/2009 | Yamazaki et al. | |
| 2009/0310265 A1 | 12/2009 | Fukuoka et al. | |
| 2010/0013907 A1 | 1/2010 | Lee | |
| 2010/0140613 A1* | 6/2010 | Kimura | H01L 27/124 257/E29.094 |
| 2010/0193804 A1 | 8/2010 | Brown et al. | |
| 2011/0108706 A1 | 5/2011 | Koyama | |
| 2011/0115054 A1 | 5/2011 | Cheng et al. | |
| 2011/0176038 A1 | 7/2011 | Kurokawa et al. | |
| 2011/0215323 A1 | 9/2011 | Kurokawa et al. | |
| 2011/0221704 A1 | 9/2011 | Kurokawa et al. | |
| 2011/0221723 A1 | 9/2011 | Kurokawa et al. | |
| 2011/0310061 A1 | 12/2011 | Ikeda et al. | |
| 2011/0310063 A1 | 12/2011 | Kurokawa et al. | |
| 2012/0049242 A1 | 3/2012 | Atanackovic et al. | |
| 2012/0267695 A1 | 10/2012 | Yamashita | |
| 2013/0015332 A1 | 1/2013 | Kozuma | |
| 2013/0044917 A1 | 2/2013 | Kurokawa | |
| 2013/0075594 A1 | 3/2013 | Kozuma | |
| 2013/0161701 A1* | 6/2013 | Tashiro | H01L 29/66 257/239 |
| 2013/0162778 A1 | 6/2013 | Kurokawa | |
| 2013/0222584 A1 | 8/2013 | Aoki et al. | |
| 2013/0234027 A1 | 9/2013 | Kurokawa | |
| 2013/0250274 A1 | 9/2013 | Kurokawa | |
| 2013/0285046 A1 | 10/2013 | Yamazaki | |
| 2014/0056405 A1 | 2/2014 | Kurokawa et al. | |
| 2014/0151838 A1* | 6/2014 | Iizuka | H01L 27/1462 438/66 |
| 2015/0021598 A1 | 1/2015 | Ikeda et al. | |
| 2015/0034831 A1 | 2/2015 | Miyake et al. | |
| 2015/0060675 A1 | 3/2015 | Akimoto et al. | |
| 2015/0380450 A1 | 12/2015 | Okamoto et al. | |
| 2016/0118426 A1 | 4/2016 | Kurokawa et al. | |
| 2016/0293649 A1 | 10/2016 | Kurokawa et al. | |

FOREIGN PATENT DOCUMENTS

| | | |
|---|---|---|
| CN | 102593132 A | 7/2012 |
| CN | 102792677 A | 11/2012 |
| EP | 1592066 A | 11/2005 |
| EP | 2154731 A | 2/2010 |
| EP | 2634821 A | 9/2013 |
| EP | 2908351 A | 8/2015 |
| JP | 02-143573 A | 6/1990 |
| JP | 02-187062 A | 7/1990 |
| JP | 05-013808 A | 1/1993 |
| JP | 2005-079438 A | 3/2005 |
| JP | 2005-317581 A | 11/2005 |
| JP | 2008-525161 | 7/2008 |
| JP | 2008-235477 A | 10/2008 |
| JP | 2009-105358 A | 5/2009 |
| JP | 2009-194260 A | 8/2009 |
| JP | 2010-028109 A | 2/2010 |
| JP | 2010-041042 A | 2/2010 |
| JP | 2010-114186 A | 5/2010 |
| JP | 2010-157665 A | 7/2010 |
| JP | 2011-003739 A | 1/2011 |
| JP | 2011-119950 A | 6/2011 |
| JP | 2011-211699 A | 10/2011 |
| JP | 2012-099580 A | 5/2012 |
| JP | 5058255 | 10/2012 |
| JP | 2012-227889 A | 11/2012 |
| JP | 2013-004686 A | 1/2013 |
| JP | 2013-161868 A | 8/2013 |
| JP | 2013-258314 A | 12/2013 |
| JP | 2014-082420 A | 5/2014 |
| KR | 2008-0085695 A | 9/2008 |
| KR | 2009-0131252 A | 12/2009 |
| KR | 2010-0061393 A | 6/2010 |
| KR | 2013-0007596 A | 1/2013 |
| TW | 201214684 | 4/2012 |
| WO | WO-2006/071922 | 7/2006 |
| WO | WO-2008/156023 | 12/2008 |

(56) References Cited

FOREIGN PATENT DOCUMENTS

| WO | WO-2011/067878 | 6/2011 |
| WO | WO-2011/111549 | 9/2011 |

OTHER PUBLICATIONS

International Search Report (Application No. PCT/IB2015/053951) dated Sep. 1, 2015.
Written Opinion (Application No. PCT/IB2015/053951) dated Sep. 1, 2015.

* cited by examiner

FIG. 18A1
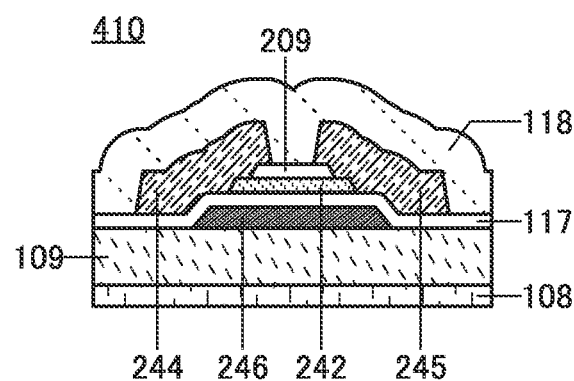
FIG. 18A2
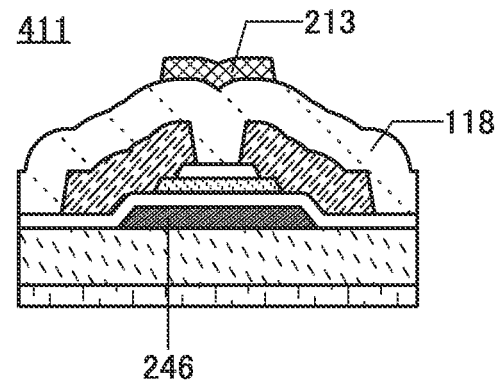
FIG. 18B1
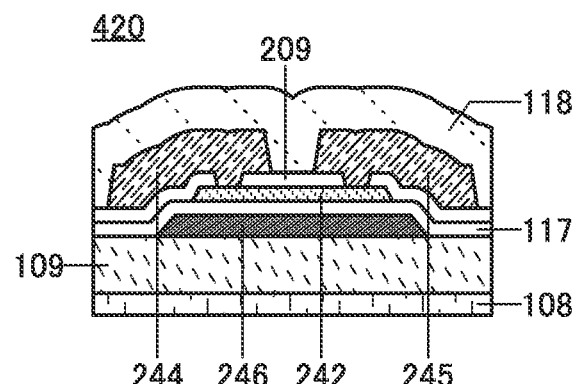
FIG. 18B2
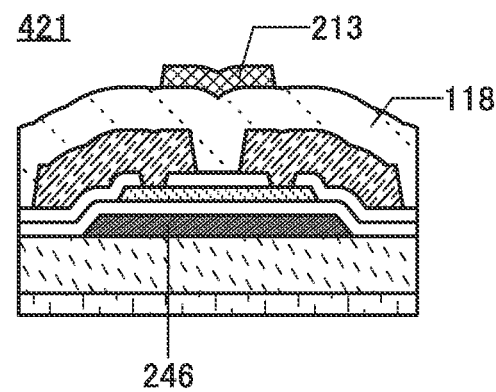

FIG. 19A1
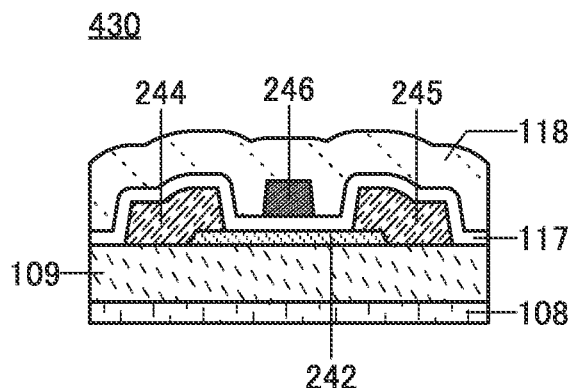
FIG. 19A2
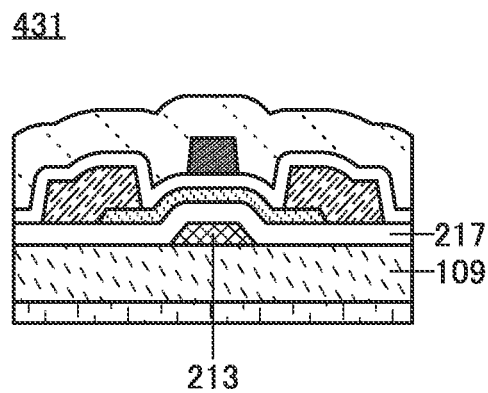
FIG. 19A3
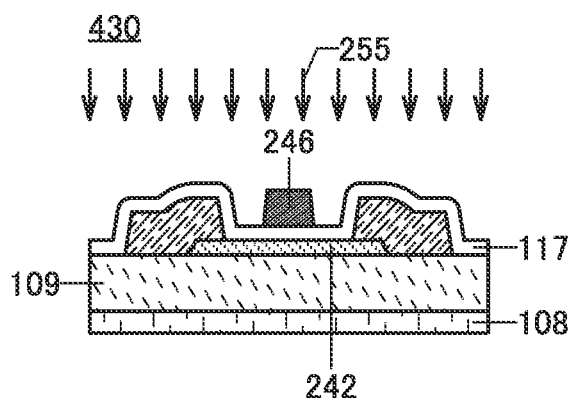
FIG. 19B1
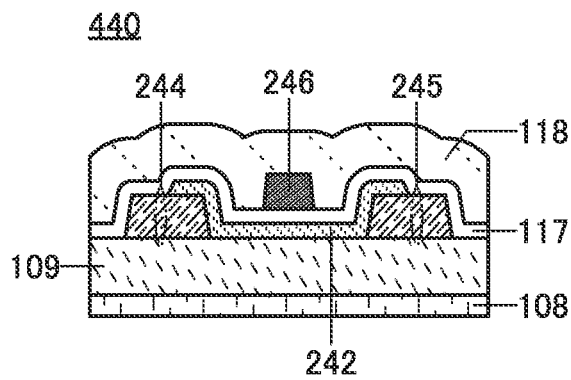
FIG. 19B2
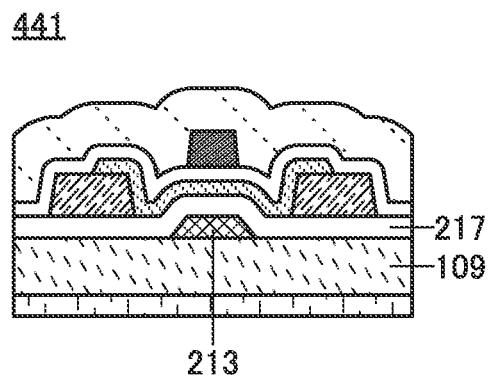

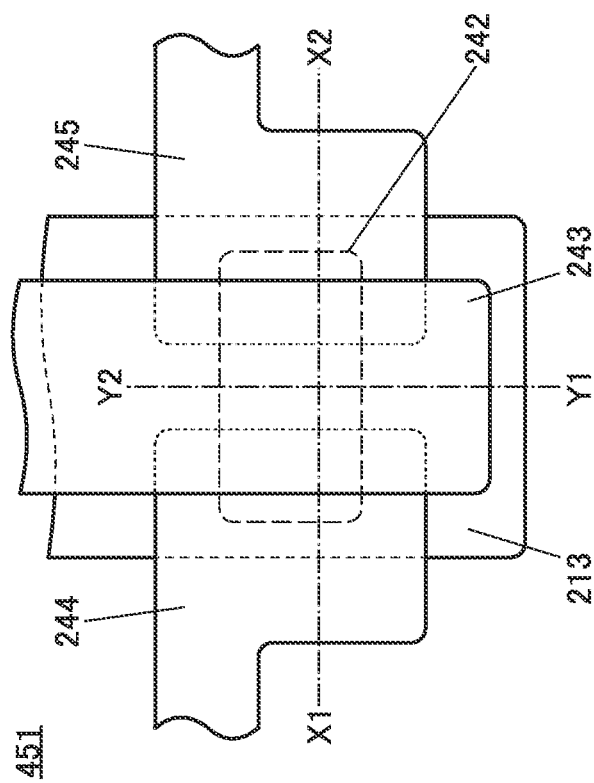
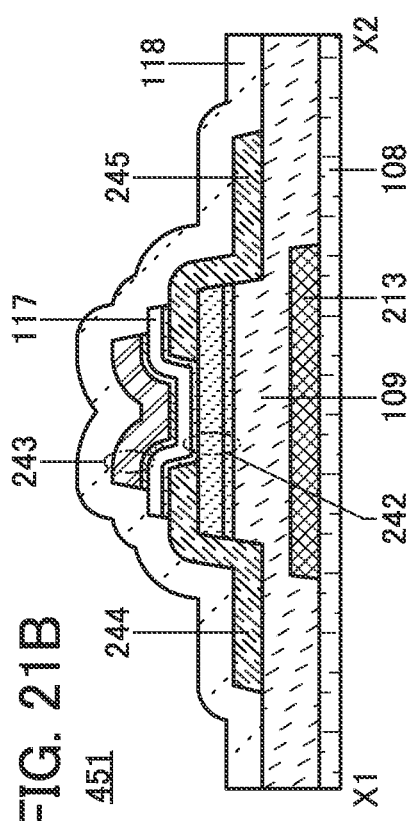

SEMICONDUCTOR DEVICE INCLUDING PHOTOELECTRIC CONVERSION ELEMENT

TECHNICAL FIELD

One embodiment of the present invention relates to an imaging device, specifically relates to an imaging device including a plurality of pixels provided with photosensors, and further relates to an electronic device including the imaging device.

Note that one embodiment of the present invention is not limited to the above technical field. For example, one embodiment of the present invention relates to an object, a method, or a fabricating method. Furthermore, the present invention relates to a process, a machine, manufacture, or a composition (a composition of matter). Furthermore, one embodiment of the present invention relates to a memory device, a processor, a driving method of them, or a fabricating method of them.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an imaging device, an electronic device, and the like include a semiconductor element or a semiconductor circuit in some cases. Therefore, a display device, a light-emitting device, a lighting device, an electro-optical device, an imaging device, an electronic device, and the like include a semiconductor device in some cases.

BACKGROUND ART

Imaging devices are normally incorporated in mobile phones, and have come into widespread use (e.g., Patent Document 1). In particular, CMOS imaging sensors have features of low price, high resolution, low power consumption, and the like as compared with CCD image sensors. Many of imaging devices are formed using CMOS image sensors.

PRIOR ART DOCUMENT

Patent Document

[Patent Document 1] U.S. Pat. No. 7,046,282

SUMMARY OF THE INVENTION

Problems to be Solved by the Invention

Improvement in dynamic range is required for imaging devices using CMOS imaging sensors in order that imaging under a variety of environments becomes possible.

In addition, low power consumption is one of the important performances for evaluation of the performance of an imaging device. In particular, for a portable electronic device such as a mobile phone, high power consumption by an imaging device shortens the continuous operating time.

An object of one embodiment of the present invention is to provide an imaging device with improved dynamic range, or the like. In addition, an object of one embodiment of the present invention is to provide an imaging device whose captured image quality is good, or the like. In addition, an object of one embodiment of the present invention is to provide a low-power-consumption imaging device, or the like. In addition, an object of one embodiment of the present invention is to provide an imaging device with high productivity, or the like. In addition, an object of one embodiment of the present invention is to provide a novel imaging device, a novel semiconductor device, or the like.

Note that the description of these objects does not preclude the existence of other objects. Note that, in one embodiment of the present invention, there is no need to achieve all the objects. Note that objects other than these will be apparent from the description of the specification, the drawings, the claims, and the like, and objects other than these can be derived from the description of the specification, the drawings, the claims, and the like.

Means for Solving the Problems

One embodiment of the present invention is an imaging device including a photoelectric conversion element, first to fourth transistors, a capacitor, and first to seventh wirings. The photoelectric conversion element includes an n-type semiconductor and a p-type semiconductor. The first wiring is electrically connected to one of the n-type semiconductor and the p-type semiconductor. The other of the n-type semiconductor and the p-type semiconductor is electrically connected to one of a source and a drain of the first transistor. A gate of the first transistor is electrically connected to the second wiring. The other of the source and the drain of the first transistor is electrically connected to a first node. One of a source and a drain of the second transistor is electrically connected to the third wiring. The other of the source and the drain of the second transistor is electrically connected to the first node. A gate of the second transistor is electrically connected to the fourth wiring. One electrode of the capacitor is electrically connected to the first node. The other electrode of the capacitor is electrically connected to the first wiring. A gate of the third transistor is electrically connected to the first node. One of a source and a drain of the third transistor is electrically connected to the fifth wiring. The other of the source and the drain of the third transistor is electrically connected to one of a source and a drain of the fourth transistor. The other of the source and the drain of the fourth transistor is electrically connected to the sixth wiring. A gate of the fourth transistor is electrically connected to the seventh wiring.

It is preferable that the photoelectric conversion element include an i-type semiconductor, and that the total area of a space where each of the first to fourth transistors and the i-type semiconductor overlap with each other, a space where the capacitor and the i-type semiconductor overlap with each other, and a space where each of the first to seventh wirings and the i-type semiconductor overlap with each other be less than or equal to 35% of an area of the i-type semiconductor in a plan view.

It is preferable that the first to fourth transistors include an oxide semiconductor as a semiconductor in which a channel is formed.

Furthermore, the semiconductor used in the first to fourth transistors may have a band gap width different from that of the i-type semiconductor in the photoelectric conversion element.

Alternatively, one embodiment of the present invention is an imaging device including at least first and second photoelectric conversion elements. The first and second photoelectric conversion elements include i-type semiconductors. The i-type semiconductor included in the first photoelectric conversion element and the i-type semiconductor included in the second photoelectric conversion element are adjacent with an n-type semiconductor or a p-type semiconductor positioned therebetween.

Effect of the Invention

According to one embodiment of the present invention, an imaging device with improved dynamic range, or the like can be provided. Furthermore, an imaging device whose captured image quality is improved, or the like can be provided. Furthermore, an imaging device with short imaging interval, or the like can be provided. Furthermore, an imaging device with low power consumption, or the like can be provided. Furthermore, an object is to provide an imaging device with high productivity, or the like. Furthermore, a novel imaging device, a novel semiconductor device, or the like can be provided.

Note that the description of these effects does not preclude the existence of other effects. Note that one embodiment of the present invention does not necessarily achieve all these effects. Note that effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIGS. 18A1-18B2 Views illustrating embodiments of a transistor.

FIGS. 19A1-19B2 Views illustrating embodiments of a transistor.

FIGS. 21A-21C Views illustrating an embodiment of a transistor.

MODE FOR CARRYING OUT THE INVENTION

Figure 1A:
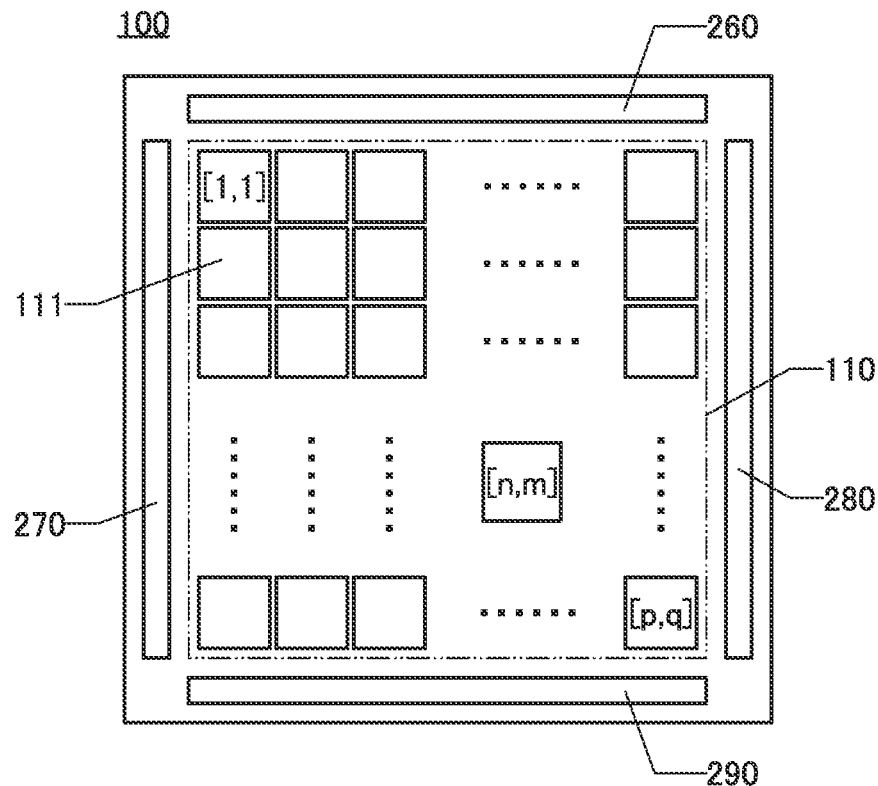
FIGS. 1A-1B Views illustrating configuration examples of an imaging device of one embodiment of the present invention.

Embodiments of the present invention will be described below in detail with reference to the drawings. However, the present invention is not limited to the description below, and it is easily understood by those skilled in the art that modes and details thereof can be modified in various ways. Furthermore, the present invention is not construed as being limited to the contents of description of the embodiments. Note that in all drawings for illustrating the embodiments, portions that are identical or portion having similar functions are denoted by the same reference numerals, and their repetitive description may sometimes be omitted.

In addition, in this specification and the like, the term such as an "electrode" or a "wiring" does not functionally limit the components. For example, an "electrode" is used as part of a "wiring" in some cases, and vice versa. Furthermore, the term such as an "electrode" or a "wiring" can include the case where a plurality of "electrodes" and "wirings" are formed in an integrated manner.

In addition, in the case where it is explicitly described in this specification and the like that X and Y are connected, the case where X and Y are electrically connected, the case where X and Y are functionally connected, and the case where X and Y are directly connected are supposed to be disclosed in this specification and the like. Accordingly, without being limited to a predetermined connection relation, for example, a connection relation shown in drawings or text, a connection relation other than that shown in the drawings or text is supposed to be described in the drawings or the text.

Here, X and Y denote an object (e.g., a device, an element, a circuit, a wiring, an electrode, a terminal, a conductive film, a layer, or the like).

As an example of the case where X and Y are directly connected, there are the case where an element that allows an electrical connection between X and Y (e.g., a switch, a transistor, a capacitor, an inductor, a resistor, a diode, a display element, a light-emitting element, a load, and the like) is not connected between X and Y, and the case where X and Y are connected without the element that allows the electrical connection between X and Y (e.g., a switch, a transistor, a capacitor, an inductor, a resistor, a diode, a display element, a light-emitting element, a load, and the like) provided therebetween.

As an example of the case where X and Y are electrically connected, one or more elements that enable electrical connection between X and Y (e.g., a switch, a transistor, a capacitor, an inductor, a resistor, a diode, a display element, a light-emitting element, a load, and the like) can be connected between X and Y. Note that a switch has a function of controlling its own on or off. That is, a switch has a function of becoming a conductive state (on state) or a non-conductive state (off state) to control whether to send or not to send current. Alternatively, the switch has a function of selecting and changing a current flowing path. Note that the case where X and Y are electrically connected includes the case where X and Y are directly connected.

As an example of the case where X and Y are functionally connected, one or more circuits that enable functional connection between X and Y (e.g., a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (a step-up circuit, a step-down circuit, or the like) or a level shifter circuit for changing the potential level of a signal); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit, or the like) can be connected between X and Y. Note that, as an example, in the case where a signal output from A is transmitted to B, even when another circuit is positioned between X and Y, X and Y are supposed to be functionally connected. Note that the case where X and Y are functionally connected is supposed to include the case where X and Y are directly connected and the case where X and Y are electrically connected.

Note that, in the case where it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or without another circuit provided therebetween) are supposed to be disclosed in this specification and the like. That is, in the case where it is explicitly described that they are electrically connected, the same contents as that in the case where it is simply described just that they are connected are supposed to be disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using the following expressions.

For example, it is possible to express "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected in this order." Alternatively, it is possible to express "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order." Alternatively, it is possible to express "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order." The connection order in a circuit configuration is defined by using an expression similar to these examples; thus, a source (or a first terminal or the like) and a drain (or a second terminal or the like) of a transistor can be distinguished to specify the technical scope.

Alternatively, as another expression, it is possible to express "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, the first connection path is a path on which Z1 is located, the drain (or the second terminal or the like) of the transistor is electrically connected to Y through at least a third connection path, the third connection path does not include the second connection path, and the third connection path is a path on which Z2 is located." Alternatively, it is possible to express "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Alternatively, it is possible to express "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third connection path does not include a fourth connection path, and the fourth electrical path is an electrical path from the drain (or the second terminal or the like) of the transistor to the source (or the first terminal or the like) of the transistor." The connection path in a circuit configuration is defined by using an expression similar to these examples; thus, a source (or a first terminal or the like) and a drain (or a second terminal or the like) of a transistor can be distinguished to specify the technical scope.

Note that these expressions are examples and there is no limitation to these expressions. Here, X, Y, Z1, and Z2 denote objects (e.g., a device, an element, a circuit, a wiring, an electrode, a terminal, a conductive film, a layer, and the like).

Note that even when independent components are electrically connected to each other in a circuit diagram, one component has functions of a plurality of components in some cases. For example, when part of a wiring also functions as an electrode, one conductive film has functions as both the components, a function as the wiring and a function as the electrode. Thus, electrical connection in this specification includes in its category such a case where one conductive film has functions of a plurality of components.

Note that in this specification and the like, a transistor can be formed using a variety of substrates. The type of a substrate is not limited to a certain type. As an example of the substrates, there is a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like. As an example of a glass substrate, there is barium borosilicate glass, aluminoborosilicate glass, soda lime glass, or the like. As an example of a flexible substrate, there is a flexible synthetic resin such as plastics typified by polyethylene terephthalate (PET), polyethylene naphthalate (PEN), and polyether sulfone (PES), or acrylic. As an example of an attachment film, there is vinyl such as polyvinyl fluoride or vinyl chloride, polypropylene, and polyester. As an example of a base material film, there is polyester, polyamide, polyimide, an inorganic vapor deposition film, paper, or the like. Specifically, a transistor is formed using a semiconductor substrate, a single crystal substrate, an SOI substrate, or the like; thus, it is possible to fabricate a transistor with few variations in characteristics, size, shape, or the like and with high current supply capability and a small size. By forming a circuit with the use of such a transistor, power consumption of the circuit can be reduced or the circuit can be highly integrated.

Note that a transistor may be formed using one substrate, and then the transistor may be transferred to another substrate, so that the transistor may be positioned over the substrate. In addition to the above substrates over which the transistor can be formed, there is a paper substrate, a cellophane substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), or the like), a leather substrate, a rubber substrate, or the like as an example of substrates to which the transistor is transferred. By using such a substrate, it is possible to form a transistor with excellent properties, to form a transistor with low power consumption, to fabricate a device that is hard to break, to provide heat resistance, or to achieve reduction in weight or thickness.

Furthermore, the position, the size, the range, and the like of each component illustrated in the drawings and the like do not represent the actual position, size, range, and the like in some cases to facilitate understanding of the invention. Therefore, the disclosed invention is not necessarily limited to the position, the size, the range, or the like disclosed in the drawings and the like. For example, a resist mask or the like is unintentionally reduced in size in some cases by treatment such as etching in the actual fabricating process, which is omitted in some cases to facilitate understanding when illustrated.

Furthermore, especially in a top view (also referred to as "a plan view"), illustration of some components is omitted in some cases to make the drawings easy to understand. In addition, illustration of some hidden lines and the like is omitted in some cases.

Note that the term such as "over" or "under" in this specification and the like does not limit the positional relation where the components are directly on or directly below and in direct contact. For example, the expression "electrode B over insulating layer A" does not necessarily mean that the electrode B is on and in direct contact with the insulating layer A and does not exclude the case where another component is included between the insulating layer A and the electrode B.

Furthermore, functions of the source and the drain might be switched depending on operation conditions, e.g., when a transistor having a different polarity is employed or a direction of current flow is changed in circuit operation; accordingly, it is difficult to define whichever serves as a source or a drain. Thus, the terms source and drain can be interchanged and used in this specification.

In addition, in this specification, "parallel" indicates a state where the angle formed between two straight lines is greater than or equal to −10° and less than or equal to 10°, and accordingly also includes the case where the angle is greater than or equal to −5° and less than or equal to 5°. Furthermore, "substantially parallel" indicates a state where the angle formed between two straight lines is greater than or equal to −30° and less than or equal to 30°. In addition, "perpendicular" or "orthogonal" indicates a state where the angle formed between two straight lines is greater than or equal to 80° and less than or equal to 100°, and accordingly also includes the case where the angle is greater than or equal to 85° and less than or equal to 95°. In addition, "substantially perpendicular" indicates a state where the angle formed between two straight lines is greater than or equal to 60° and less than or equal to 120°.

In addition, a voltage refers to a potential difference between a given potential and a reference potential (e.g., a ground potential (a GND potential) or a source potential) in many cases. Therefore, a voltage can be referred to as a potential.

Note that an impurity in a semiconductor refers to, for example, elements other than the main components forming the semiconductor. For example, an element with a concentration lower than 0.1 atomic % can be regarded as an impurity. Containing an impurity causes increase in the DOS (Density of State) in a semiconductor, decrease in the carrier mobility, or decrease in the crystallinity, in some cases. In the case where the semiconductor is an oxide semiconductor, as an impurity that changes the characteristics of the semiconductor, there are Group 1 elements, Group 2 elements, Group 13 elements, Group 14 elements, Group 15 elements, and transition metals other than the main components, for example; there are hydrogen (included also in water), lithium, sodium, silicon, boron, phosphorus, carbon, nitrogen, and the like, for example. In the case of an oxide semiconductor, oxygen vacancy may sometimes be formed by entry of impurities such as hydrogen, for example. Furthermore, in the case where the semiconductor is silicon, as an impurity that changes characteristics of the semiconductor, there are oxygen, Group 1 elements except hydrogen, Group 2 elements, Group 13 elements, Group 15 elements, and the like, for example.

Note that ordinal numbers such as "first" and "second" in this specification and the like are used in order to avoid confusion among components and do not denote the priority or the order such as the order of steps or the stacking order. In addition, even a term which is not given an ordinal number in this specification and the like may sometimes be given an ordinal number in a scope of claims in order to avoid confusion among components. In addition, even a term which is given an ordinal number in this specification and the like may sometimes be given a different ordinal number in a scope of claims. Moreover, even when a term is given an ordinal number in this specification and the like, the ordinal number may sometimes be omitted in a scope of claims or the like.

Note that in this specification and the like, the "channel length" refers to, for example, a distance between a source (a source region or a source electrode) and a drain (a drain region or a drain electrode) in a region where a semiconductor (or a portion in a semiconductor where a current flows when a transistor is on) and a gate electrode overlap or in a region where a channel is formed, in a top view of the transistor. Note that, in one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

In addition, the "channel width" refers to, for example, the length of a portion where a source and a drain face each other in a region where a semiconductor (or a portion in a semiconductor where a current flows when a transistor is on) and a gate electrode overlap or in a region where a channel is formed. Note that, in one transistor, channel widths in all regions do not necessarily have the same value. In other words, the channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in respect to the proportion of a channel region formed in a top surface of a semiconductor in some cases. In that case, an effective channel width where a channel is actually formed is greater than an apparent channel width shown in the top view.

Meanwhile, in a transistor having a three-dimensional structure, an effective channel width is difficult to estimate by actual measurement in some cases. For example, to estimate an effective channel width from a design value, it is necessary to assume that the shape of a semiconductor is already known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap is referred to as a "surrounded channel width (SCW: Surrounded Channel Width)" in some cases. Furthermore, in this specification, in the case where a channel width is simply written, a surrounded channel width or an apparent channel width is denoted in some cases. Alternatively, in this specification, in the case where a channel width is simply written, an effective channel width is denoted in some cases. Note that the values of a channel length, a channel width, an effective channel width, an apparent channel width, a surrounded channel width, and the like can be determined by obtaining a cross-sectional TEM image and the like, analyzing the image, and the like.

Note that in the case where field-effect mobility, a current value per channel width, and the like of a transistor are obtained by calculation, calculation is employed using a surrounded channel width in some cases. In that case, a value different from one in the case where calculation is employed using an effective channel width is obtained in some cases.

Furthermore, a high power supply potential $V_{DD}$ (hereinafter also simply referred to as "$V_{DD}$" or "H potential") is a power supply potential higher than the low power supply potential $V_{SS}$. Moreover, a low power supply potential $V_{SS}$ (hereinafter also simply referred to as "$V_{SS}$" or "L potential") is a power supply potential of a potential lower than the high power supply potential $V_{DD}$. In addition, a ground potential can be used as $V_{DD}$ or $V_{SS}$. For example, in the case where a ground potential is $V_{DD}$, $V_{SS}$ is lower than the ground potential, and in the case where a ground potential is $V_{SS}$, $V_{DD}$ is higher than the ground potential.

Embodiment 1

In this embodiment, an imaging device of one embodiment of the present invention will be described with reference to the drawings.

Configuration Example of Imaging Device 100

FIG. 1(A) is a plan view illustrating a configuration example of an imaging device 100 of one embodiment of the present invention. The imaging device 100 includes a pixel portion 110, a first circuit 260, a second circuit 270, a third circuit 280, and a fourth circuit 290. The pixel portion 110 includes a plurality of pixels 111 (imaging elements) arranged in a matrix with p rows and q columns (p and q are each a natural number greater than or equal to 2). The first circuit 260 to the fourth circuit 290 are connected to the plurality of pixels 111 and have functions of supplying signals for driving the plurality of pixels 111. Note that, in this specification and the like, the first circuit 260 to the fourth circuit 290 and the like may sometimes be referred to as "peripheral circuit" or "driving circuit." For example, the first circuit 260 can be regarded as part of the peripheral circuit.

For example, the first circuit 260 or the fourth circuit 290 has a function of processing analog signals output from the pixels 111. For example, the first circuit 260 may include a signal processing circuit 261, a column driver circuit 262, an output circuit 263, and the like, as shown in FIG. 2.

Figure 2:
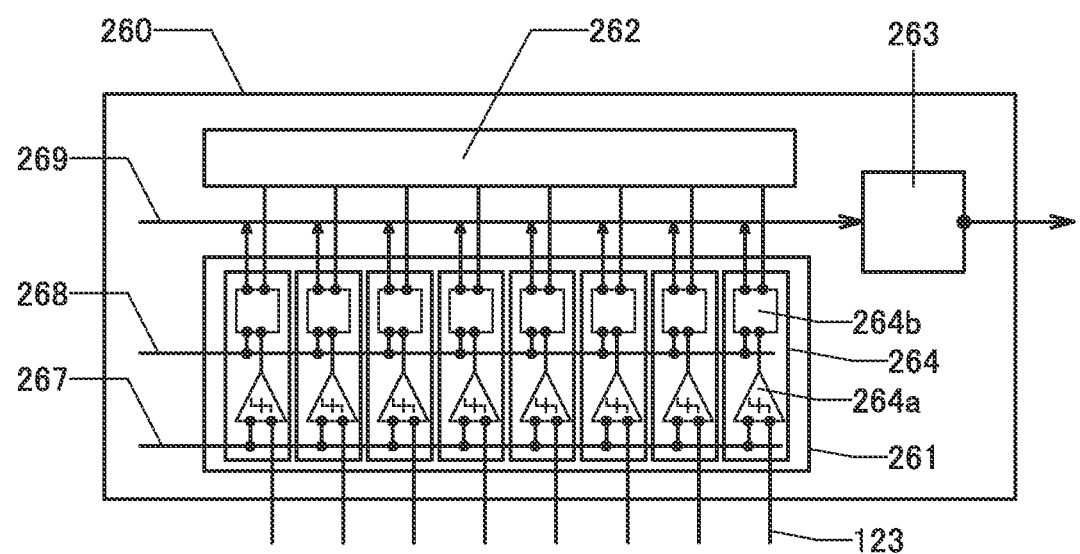
FIG. 2 A view illustrating a configuration example of a peripheral circuit.

In addition, the signal processing circuit 261 shown in FIG. 2 includes circuits 264 which are provided for each column. The circuit 264 can have a function of performing signal processing such as removal of noise and analog-digital conversion. The circuit 264 shown in FIG. 2 has a function of analog-digital conversion. The signal processing circuit 261 can function as a column-parallel (column type) analog-digital conversion device.

The circuit 264 includes a comparator 264a and a counter circuit 264b. The comparator 264a has a function of comparing potentials of an analog signal input from a wiring 123 that is provided per column and a reference potential signal (e.g., a ramp signal) input from a wiring 267. A clock signal is input to the counter circuit 264b from a wiring 268. The counter circuit 264b has a function of measuring the length of a period in which a first value is output owing to the comparison operation in the comparator 264a and holding the measurement result as an N-bit digital value.

The column driver circuit 262 is also referred to as a column selection circuit, a horizontal driver circuit, or the like. The column driver circuit 262 generates a selection signal for selecting a column from which a signal is read. The column driver circuit 262 can be formed using a shift register or the like. Columns are sequentially selected by the column driver circuit 262, and a signal output from the circuit 264 in the selected column is input to the output circuit 263 via a wiring 269. The wiring 269 can function as a horizontal transfer line.

A signal input to the output circuit 263 is processed in the output circuit 263, and is output outside the imaging device 100. The output circuit 263 can be formed using a buffer circuit, for example. In addition, the output circuit 263 may have a function of controlling the timing at which a signal is output outside the imaging device 100.

In addition, for example, the second circuit 270 or the third circuit 280 has a function of generating and outputting a selection signal for selecting the pixel 111 from which a signal is read. Note that the second circuit 270 or the third circuit 280 may also be referred to as a row selection circuit or a vertical driver circuit.

The peripheral circuit includes at least one of a logic circuit, a switch, a buffer, an amplifier circuit, and a conversion circuit. Transistors or the like used for the peripheral circuit may also be formed using another part of a semiconductor that forms an after-mentioned photoelectric conversion element 136. Alternatively, transistors or the like used for the peripheral circuit may also be formed using another part of a semiconductor that forms an after-mentioned pixel driver circuit 112. Alternatively, transistors or the like used for the peripheral circuit may also be used in a combination with these transistors. Furthermore, a part of or the whole of the peripheral circuit may be mounted with a semiconductor device such as an IC.

Note that in the peripheral circuit, at least one of the first circuit 260 to the fourth circuit 290 may be omitted. For example, a function of one of the first circuit 260 and the fourth circuit 290 may be added to the other of the first circuit 260 and the fourth circuit 290 to omit the one of the first circuit 260 and the fourth circuit 290. For another example, a function of one of the second circuit 270 and the third circuit 280 may be added to the other of the second circuit 270 and the third circuit 280 to omit the one of the second circuit 270 and the third circuit 280. For another example, a function of another circuit may be added to any one of the first circuit 260 to the fourth circuit 290 to omit the other circuits than the one of the first circuit 260 to the fourth circuit 290.

Figure 1B:
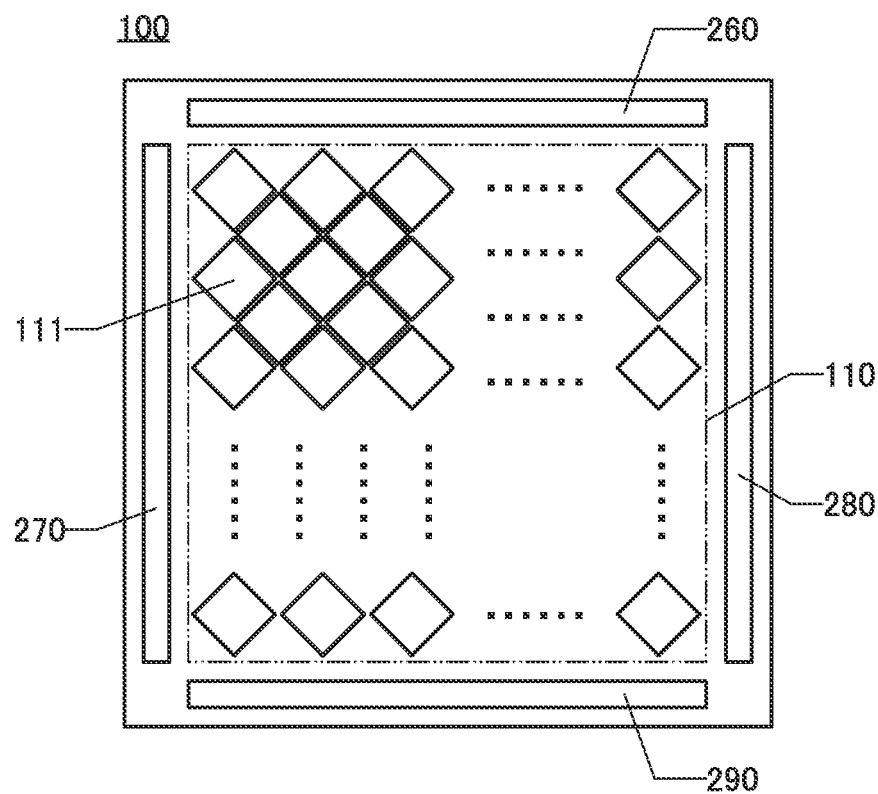

Furthermore, as illustrated in FIG. 1(B), the pixels 111 may be provided to be obliquely inclined in the pixel portion 110 included in the imaging device 100. When the pixels 111 are provided to be inclined, the space between the pixels in the row direction and the column direction (pitch) can be decreased. Accordingly, the quality of an image captured with the imaging device 100 can be further improved.

Configuration Example of Pixel 111

Figure 4A:
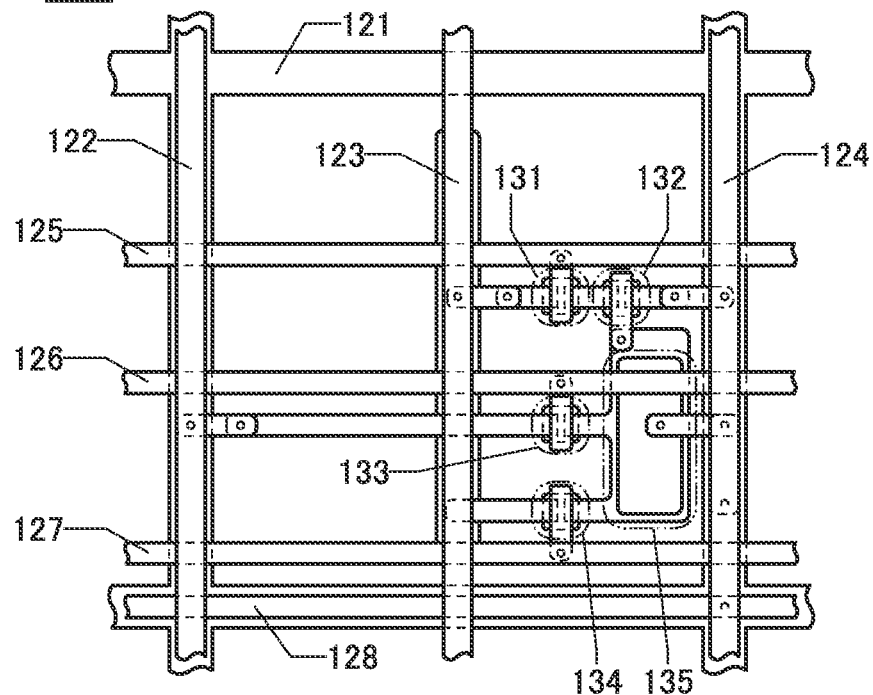
FIGS. 4A-4B A plane of a pixel driver circuit and a circuit diagram of a pixel.
Figure 4B:
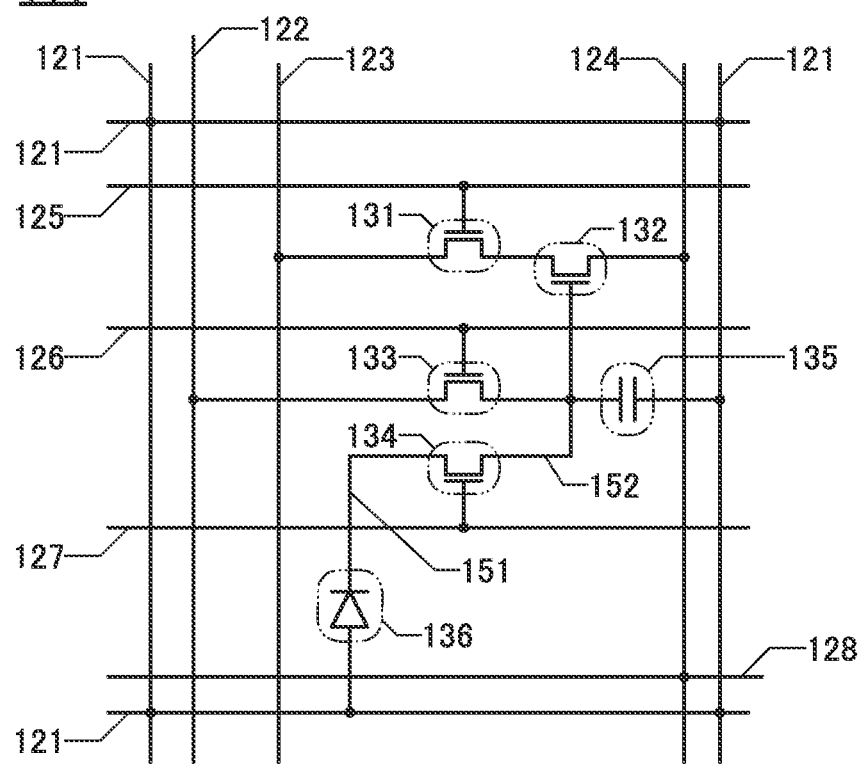
Figure 5:
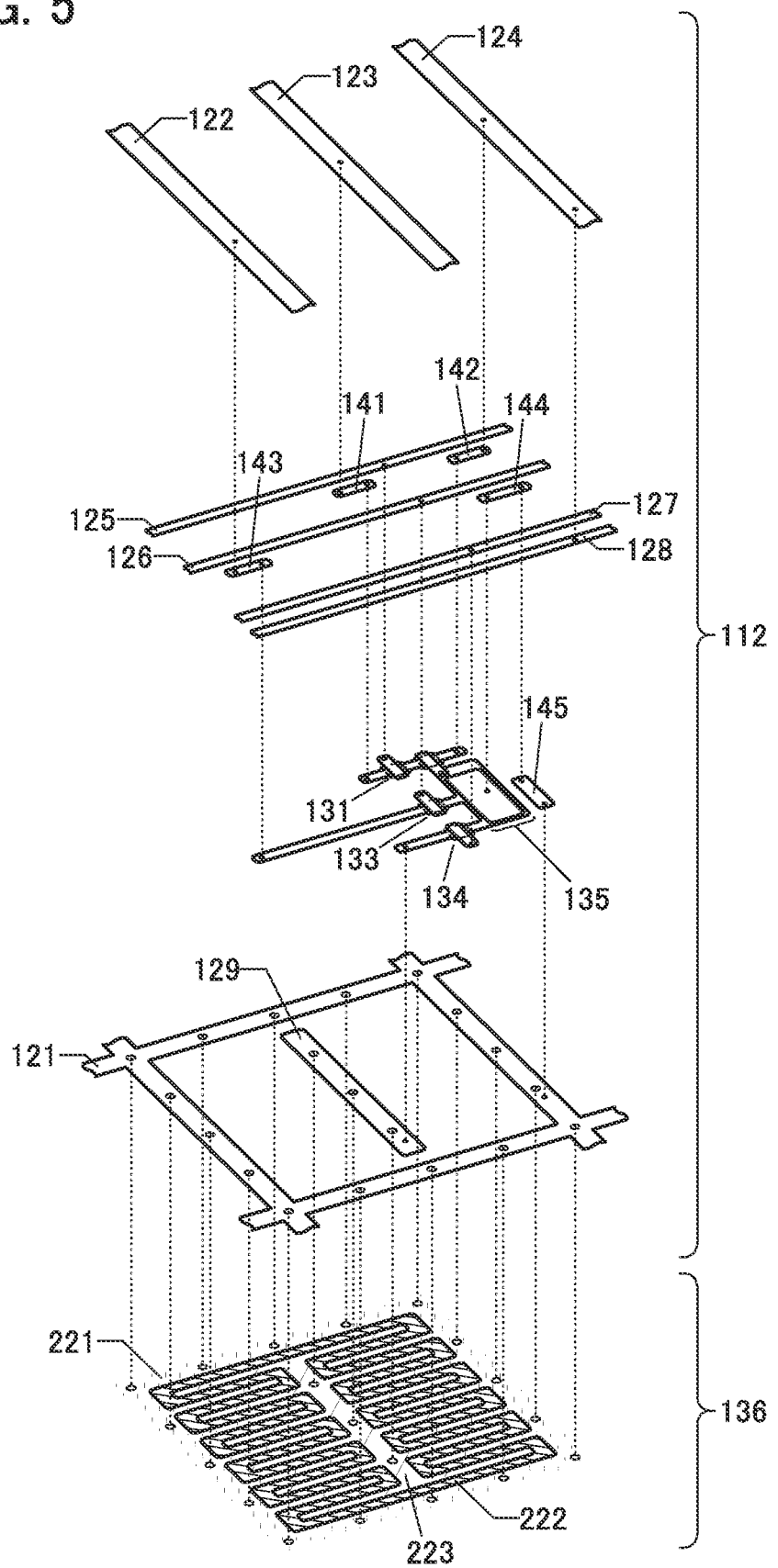
FIG. 5 A perspective view illustrating a configuration example of a pixel.

A configuration example of the pixel 111 will be described with reference to FIG. 3 to FIG. 5. The pixel 111 includes functional elements such as a transistor 131, a transistor 132, a transistor 133, a transistor 134, a capacitor 135, and a photoelectric conversion element 136. Among the functional elements included in the pixel 111, the functional elements except the photoelectric conversion element 136 constitute a circuit that is referred to as a pixel driver circuit 112. Note that the pixel driver circuit 112 is electrically connected to the photoelectric conversion element 136. The pixel driver circuit 112 has a function of generating an analog signal corresponding to the amount of light received by the photoelectric conversion element 136.

Figure 3A:
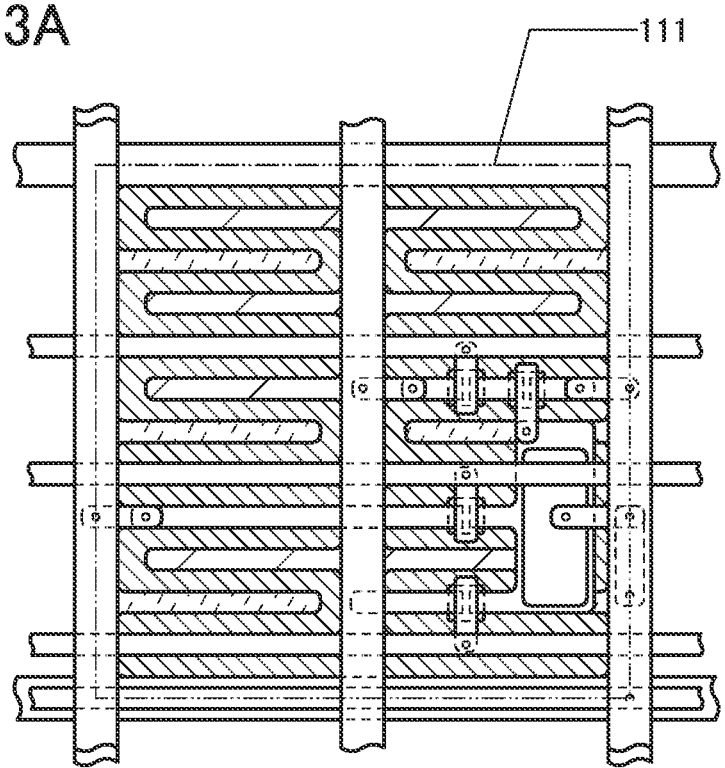
FIGS. 3A-3B Views illustrating configuration examples of a pixel.
Figure 3B:
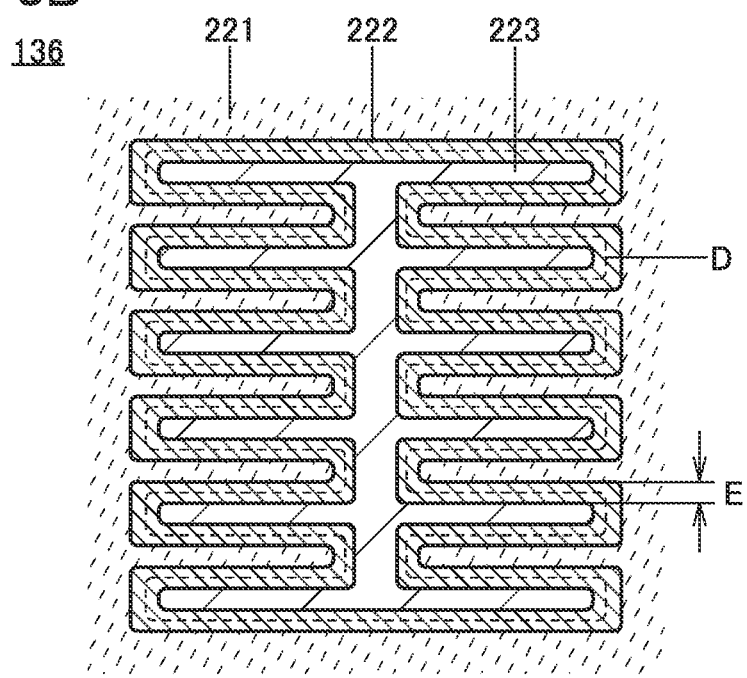

FIG. 3(A) is a plan view of the pixel 111. FIG. 3(B) is a plan view of the photoelectric conversion element 136. FIG. 4(A) is a plan view of the pixel driver circuit 112. FIG. 4(B) is a circuit diagram of the pixel 111. FIG. 5 is a perspective view illustrating a configuration of the pixel 111. The pixel 111 includes the pixel driver circuit 112 over the photoelectric conversion element 136.

The photoelectric conversion element 136 includes a p-type semiconductor 221, an i-type semiconductor 222, and an n-type semiconductor 223. In a plan view, the photoelectric conversion element 136 is formed to position the i-type semiconductor 222 between the p-type semiconductor 221 and the n-type semiconductor 223. Note that, although the photoelectric conversion element 136 can be made up of the p-type semiconductor 221 and the n-type semiconductor 223 without the i-type semiconductor 222 provided, the provision of the i-type semiconductor 222 in the photoelectric conversion element 136 can increase the light receiving sensitivity.

Note that an intrinsic semiconductor (i-type semiconductor) is ideally a semiconductor, which does not include impurities and whose Fermi level lies substantially in the middle of the band gap; but in this specification and the like, a semiconductor to which an impurity serving as a donor or an impurity serving as an acceptor is added and whose Fermi level lies substantially in the middle of the band gap is also included in the intrinsic semiconductors. Furthermore, even when a semiconductor includes an impurity serving as a donor or an impurity serving as an acceptor, the semiconductor is included in the intrinsic semiconductors as long as it is a semiconductor capable of functioning as an intrinsic semiconductor.

It is preferable that the p-type semiconductor 221 and the n-type semiconductor 223 be formed into a comb-teeth shape in a plan view and formed to engage with each other with the i-type semiconductor 222 positioned therebetween. When the p-type semiconductor 221 and the n-type semiconductor 223 have comb-teeth shapes, the length D along which the p-type semiconductor 221 and the n-type semiconductor 223 face each other can be increased. Note that the length D can be referred to as the length of a line that extends along the center of the i-type semiconductor 222 positioned between the p-type semiconductor 221 and the n-type semiconductor 223 in a plan view. Increase in the length D can improve the detection sensitivity of the photoelectric conversion element 136. Thus, the imaging device 100 with high detection sensitivity can be provided. In FIG. 3(B), the position of the length D is shown with a dashed line. In addition, in the case where the pixel 111 detects visible light, the distance E from the p-type semiconductor 221 to the n-type semiconductor 223 (i.e., the width of the i-type semiconductor 222) in a plan view is preferably greater than or equal to 800 nm (see FIG. 3(B)).

One of a source and a drain of the transistor 131 is electrically connected to the wiring 123, and the other of the source and the drain is electrically connected to one of a source and a drain of the transistor 132. A gate of the transistor 131 is electrically connected to a wiring 125. The other of the source and the drain of the transistor 132 is electrically connected to a wiring 124, and a gate of the transistor 132 is electrically connected to a node 152. One of a source and a drain of the transistor 133 is electrically connected to a wiring 122, and the other of the source and the drain is electrically connected to the node 152. A gate of the transistor 133 is electrically connected to a wiring 126. One of a source and a drain of the transistor 134 is electrically connected to a node 151, and the other of the source and the drain is electrically connected to the node 152. A gate of the transistor 134 is electrically connected to a wiring 127. One electrode (e.g., a cathode) of the photoelectric conversion element 136 (photodiode) is electrically connected to the node 151, and the other electrode (e.g., an anode) is electrically connected to a wiring 121 (see FIG. 4(A) and FIG. 4(B)).

The node 152 functions as an electric charge storage portion. In addition, the transistor 134 can function as a transfer transistor for transferring an electric charge corresponding to the amount of light received by the photoelectric conversion element 136 to the node 152. Additionally, the transistor 133 can function as a reset transistor for resetting a potential of the node 152. Furthermore, the transistor 132 can function as an amplifier transistor for amplifying an electric charge stored in the node 152. In addition, the transistor 131 can function as a reading transistor for reading a signal that has been amplified by the transistor 132.

An analog signal generated by the photoelectric conversion element 136 and the pixel driver circuit 112 is supplied to the wiring 123. In addition, the wiring 121 has a function of supplying a potential VPD, for example. The wiring 122 has a function of supplying a potential VRS, for example. The wiring 124 has a function of supplying a potential VPI, for example. The wiring 125 has a function of supplying a potential SEL, for example. The wiring 126 has a function of supplying a potential PR, for example. The wiring 127 has a function of supplying a potential TX, for example. The wiring 128 has a function of supplying a potential VPI, for example.

Furthermore, in this embodiment, the wiring 121 is provided in a net shape to surround the periphery of the pixels 111. The wiring 121 is electrically connected to the p-type semiconductor 221. The provision of the wiring 121 in a net shape can decrease variations in potential of the wiring 121 in the pixel portion 110, stabilize the operation of the imaging device 100, and improve the reliability of the imaging device 100. In addition, the one of the source and the drain of the transistor 134 may be electrically connected to a wiring 129, and the wiring 129 may be electrically connected to the n-type semiconductor 223 (see FIG. 5). In addition, the one of the source and the drain of the transistor 131 may be electrically connected to a wiring 141, and the wiring 141 may be electrically connected to the wiring 123. In addition, the other of the source and the drain of the transistor 132 may be electrically connected to a wiring 142, and the wiring 142 may be electrically connected to the wiring 124. In addition, the one of the source and the drain of the transistor 133 may be electrically connected to a wiring 143, and the wiring 143 may be electrically connected to the wiring 122. The other electrode of the capacitor 135 may be electrically connected to a wiring 144, the wiring 144 may be electrically connected to a wiring 145, and the wiring 145 may be electrically connected to the wiring 121. Note that, in this embodiment, an example in which a wiring 128 that crosses and is electrically connected to the wiring 124 is provided is shown. The provision of the wiring 128 can decrease variations in potential of the wiring 124 in the pixel portion 110, stabilize the operation of the imaging device 100, and improve the reliability of the imaging device 100. Parasitic capacitance of a transistor may be used as the capacitor 135.

It is preferable that functional elements and wirings (electrodes) included in the pixel 111 be formed over the p-type semiconductor 221 and/or the n-type semiconductor 223 as much as possible and overlap the i-type semiconductor 222 as little as possible. Specifically, the area of the i-type semiconductor 222 that is overlapped with the functional elements and wirings in a plan view is preferably less than or equal to 35%, further preferably less than or equal to 20%, and still further preferably less than or equal to 10% of the area of the i-type semiconductor 222 in a plan view. In other words, the proportion of the area actually capable of receiving light with respect to the area of the whole i-type semiconductor 222 (also referred to as "effective aperture ratio") is preferably greater than or equal to 65%, further preferably greater than or equal to 80%, and still further preferably greater than or equal to 90%. Improving the effective aperture ratio to increase the exposed area of the i-type semiconductor 222 can improve the detection sensitivity of the imaging device 100. Furthermore, the dynamic range of the imaging device 100 can be increased.

Figure 6:
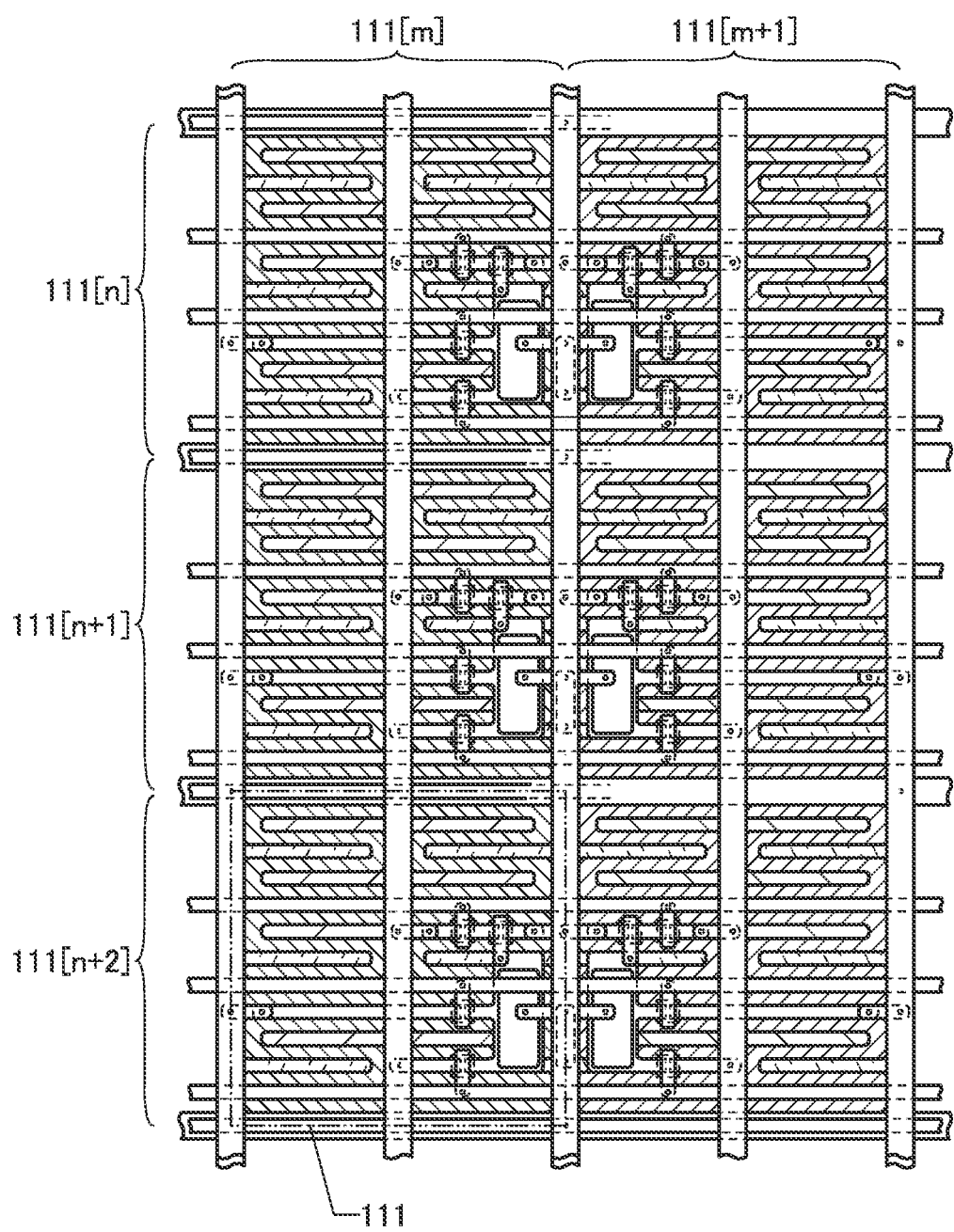
FIG. 6 A view illustrating an example where pixels are arranged in a matrix.
Figure 7:
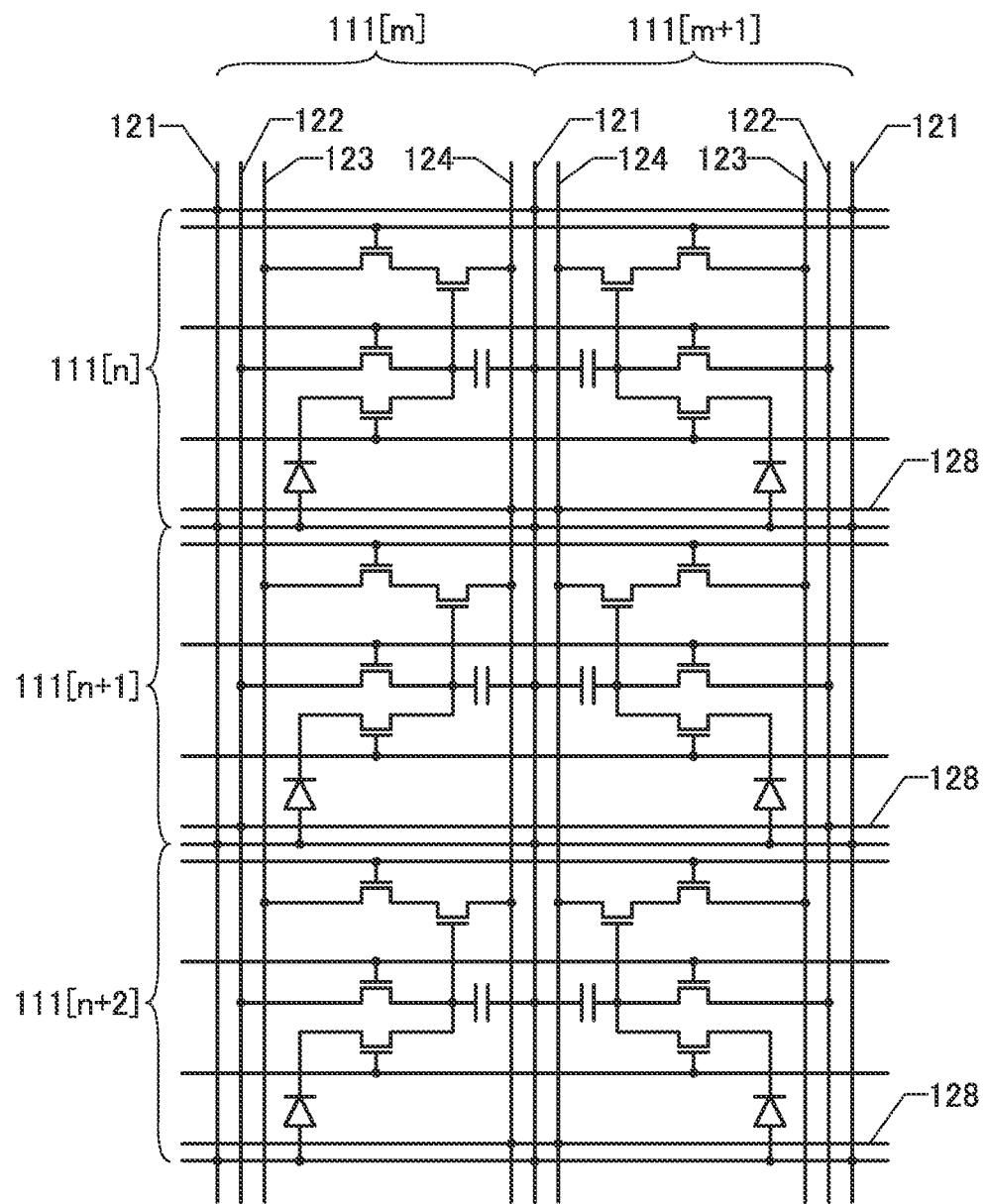
FIG. 7 A view illustrating a circuit configuration example of pixels arranged in a matrix.

An example of arranging the plurality of pixels 111 in a matrix is shown in FIG. 6 and FIG. 7. FIG. 6 is a plan view showing an example in which the pixels 111 are arranged in a matrix with three rows (n to n+2 rows) and two columns (m and m+1 columns). FIG. 7 is a circuit diagram corresponding to FIG. 6. FIG. 6 and FIG. 7 show an example in which the configuration of the pixel 111 in the column m and that in the column m+1 (e.g., an odd number column and an even number column) are left-right reversal and mirror symmetrical.

Furthermore, the wiring 128 in the n-th row is electrically connected to the wiring 124 having a function of supplying the potential VPI, and the wiring 128 in the n+1-th row is electrically connected to the wiring 122 having a function of supplying the potential VRS. In this manner, a wiring to which the wiring 128 is electrically connected is alternated between the wiring 122 and the wiring 124 in every predetermined period, which can decrease potential variations of the potential VPI and the potential VRS in the pixel portion 110, stabilize the operation of the imaging device 100, and improve the reliability of the imaging device 100.

Figure 8:
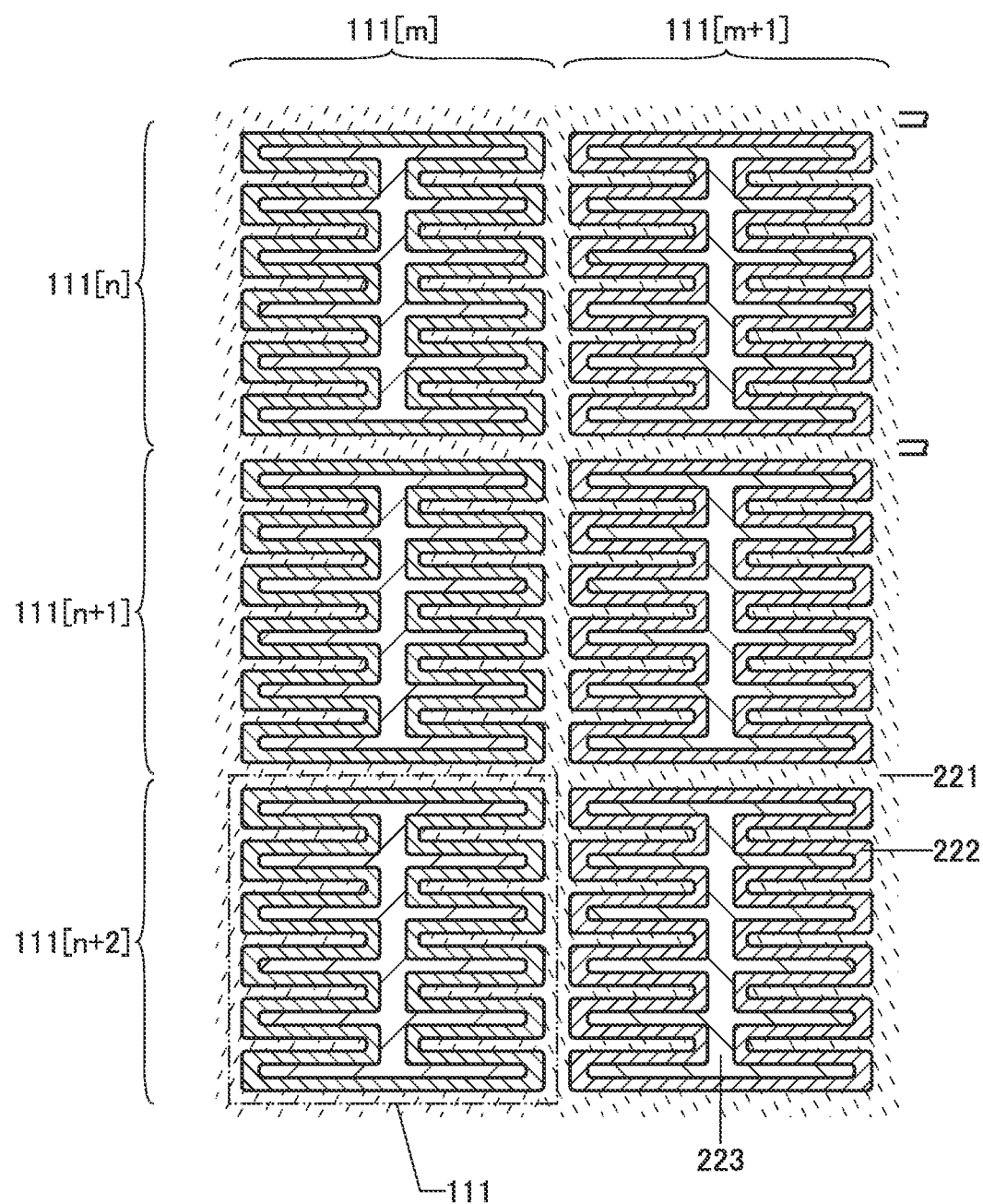
FIG. 8 A view illustrating an example where photoelectric conversion elements are arranged in a matrix.

FIG. 8 is a plan view showing an example in which the photoelectric conversion elements 136 included in the pixels 111 are arranged in a matrix with three rows (n to n+2 rows) and two columns (m and m+1 columns). The photoelectric conversion element 136 can be formed in each of the pixels 111 without dividing a semiconductor layer. Specifically, the semiconductor layer is formed in the entire pixel portion 110, and regions functioning as the p-type semiconductor 221, the n-type semiconductor 223, and the i-type semiconductor 222 can be formed in the semiconductor layer using an ion implantation method, an ion doping method, or the like. Furthermore, the i-type semiconductor 222 is surrounded by the p-type semiconductor 221 in every pixel, which can prevent electric interface between the i-type semiconductors 222 in adjacent pixels. Since it is not necessary that the semiconductor layer for constituting the photoelectric conversion element 136 be divided for each pixel, the photoelectric conversion element 136 can be efficiently provided in the pixel 111. Accordingly, the detection sensitivity of the imaging device 100 can be improved.

Furthermore, the p-type semiconductor 221 can be used as part of a wiring for supplying power supply potential. The use of the p-type semiconductor 221 as part of the wiring for supplying power supply potential can reduce variations in power supply potential in the pixel portion 110. Note that the p-type semiconductor 221 and the n-type semiconductor 223 are interchangeable.

[Color Filter and the Like]

The pixels 111 included in the imaging device 100 are used as subpixels, and each of the plurality of pixels 111 is provided with a filter that transmits light with a different wavelength band (color filter), whereby data for achieving color image display can be achieved.

Figure 9A:
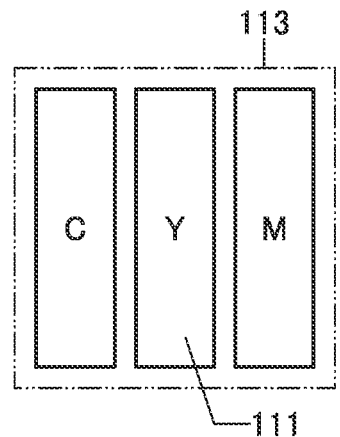
FIGS. 9A-9E Views illustrating configuration examples of a pixel.
Figure 9B:
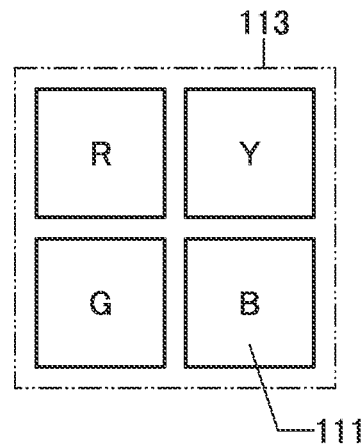
Figure 9C:
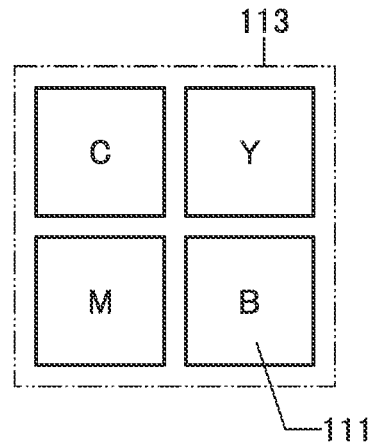
Figure 9D:
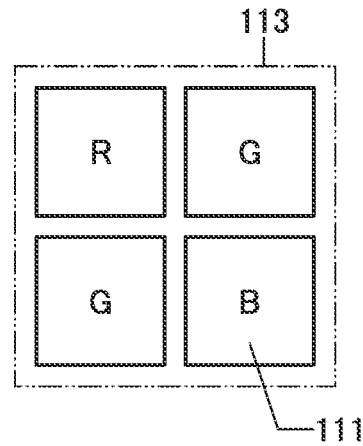
Figure 9E:
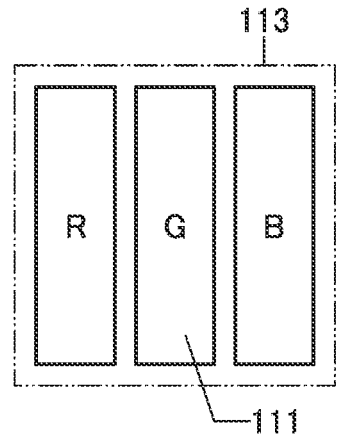

FIG. 9(E) is a plan view showing an example of the pixel 111 with which a color image is obtained. FIG. 9(E) includes a pixel 111 provided with a color filter that transmits a red (R) wavelength band (hereinafter, also referred to as a "pixel 111R"), a pixel 111 provided with a color filter that transmits a green (G) wavelength band (hereinafter, also referred to as a "pixel 111G"), and a pixel 111 provided with a color filter that transmits a blue (B) wavelength band (hereinafter, also referred to as a "pixel 111B"). The pixel 111R, the pixel 111G, and the pixel 111B collectively function as one pixel 113.

Note that the color filter used in the pixel 111 is not limited to red (R), green (G), and blue (B), and as illustrated in FIG. 9(A), color filters that transmit light of cyan (C), yellow (Y), and magenta (M) may be used. The pixels 111 that detect light with three types of different wavelength bands are provided in one pixel 113, and a full-color image can be obtained.

FIG. 9(B) illustrates the pixel 113 including a pixel 111 provided with a color filter that transmits yellow (Y) light, in addition to the pixels 111 provided with the color filters that transmit red (R), green (G), and blue (B) light. FIG. 9(C) illustrates the pixel 113 including a pixel 111 provided with a color filter that transmits blue (B) light, in addition to the pixels 111 provided with the color filters that transmit cyan (C), yellow (Y), and magenta (M) light. The pixels 111 that detect light with four different wavelength bands are provided in one pixel 113; thus, the reproducibility of colors of an obtained image can be increased.

In addition, the pixel number ratio (or the ratio of light receiving area) of the pixel 111R to the pixel 111G and the pixel 111B need not necessarily be 1:1:1. The pixel number ratio (the ratio of light receiving area) of red to green and blue may be Bayer arrangement and 1:2:1, as illustrated in FIG. 9(D). Alternatively, the pixel number ratio (the ratio of light receiving area) of red to green and blue may be 1:6:1.

Note that although the number of pixels 111 provided in the pixel 113 may be one, two or more is preferable. For example, the provision of two or more pixels 111 that detect the same wavelength band can increase the redundancy and increase the reliability of the imaging device 100.

In addition, an IR (IR: Infrared) filter that absorbs or reflects light with a wavelength shorter than or equal to a wavelength of visible light and transmits infrared light is used as the filter, whereby the imaging device 100 that detects infrared light can be achieved. Alternatively, a UV (UV: Ultra Violet) filter that absorbs or reflects light with a wavelength longer than or equal to a wavelength of visible light and transmits ultraviolet light is used as the filter, whereby the imaging device 100 that detects ultraviolet light can be achieved. Alternatively, a scintillator that turns a radiant ray into ultraviolet light or visible light is used as the filter, whereby the imaging device 100 can be used as a radiation detector that detects an X-ray or a γ-ray.

Alternatively, an ND (ND: Neutral Density) filter (dimming filter) is used as a filter 602, whereby a phenomenon of being saturated with output (hereinafter, also referred to as "output saturation"), which is caused when an excessive amount of light enters a photoelectric conversion element (light-receiving element), can be prevented. With the use of a combination of ND filters with different amounts of light reduction, the dynamic range of the imaging device can be increased.

Figure 10A:
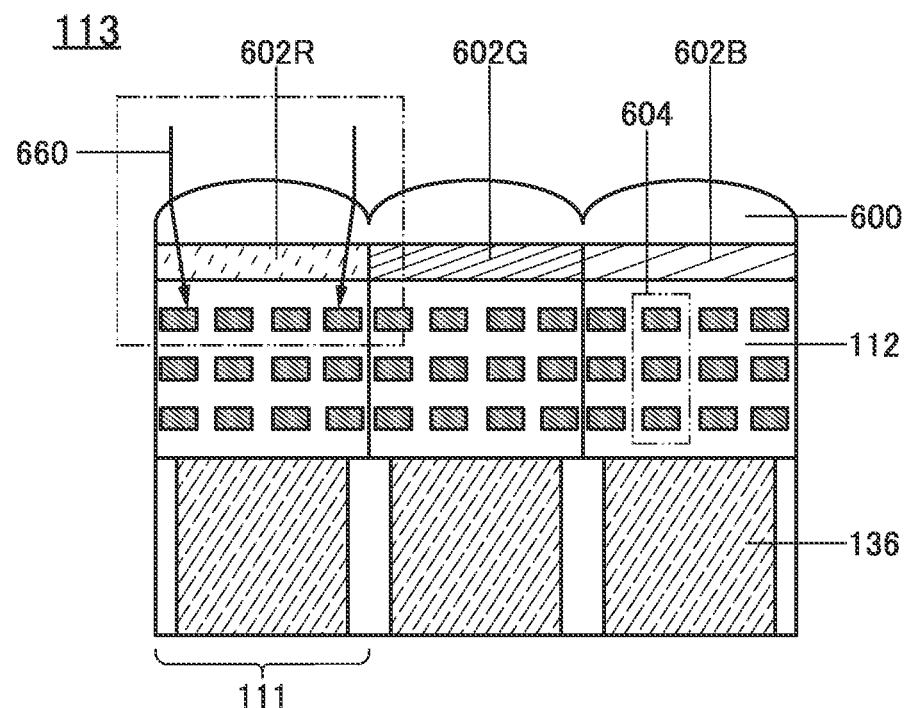
FIGS. 10A-10B Views illustrating configuration examples of a pixel.

Furthermore, besides the above-described filter, a lens may be provided in the pixel 113. Here, an arrangement example of the pixel 113, the filter 602, and a lens 600 will be described with reference to cross-sectional views in FIG. 10. With the provision of the lens 600, incident light can be efficiently received by a photoelectric conversion element. Specifically, as illustrated in FIG. 10(A), a structure where light 660 enters the photoelectric conversion element 136 through the lens 600, the filter 602 (a filter 602R, a filter 602G, or a filter 602B), a pixel driver circuit 112, and the like formed in the pixel 113 can be used.

Figure 10B:
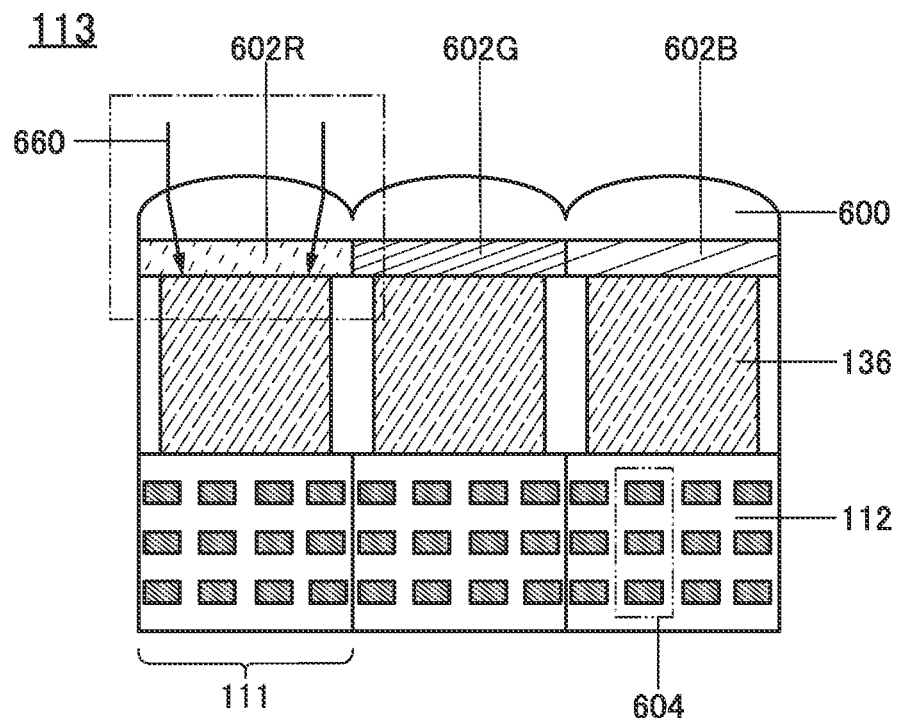

However, as illustrated in a region surrounded by a two-dot chain line, part of light 660 indicated by arrows may be blocked by part of a wiring layer 604. Thus, a structure in which the lens 600 and the filter 602 are provided on the photoelectric conversion element 136 side as illustrated in FIG. 10(B), may be employed such that the incident light is efficiently received by the photoelectric conversion element 136. When the light 660 is incident on the photoelectric conversion element 136 side, the imaging device 100 with high detection sensitivity can be provided.

This embodiment can be implemented in an appropriate combination with the structures described in the other embodiments.

Embodiment 2

Figure 11:
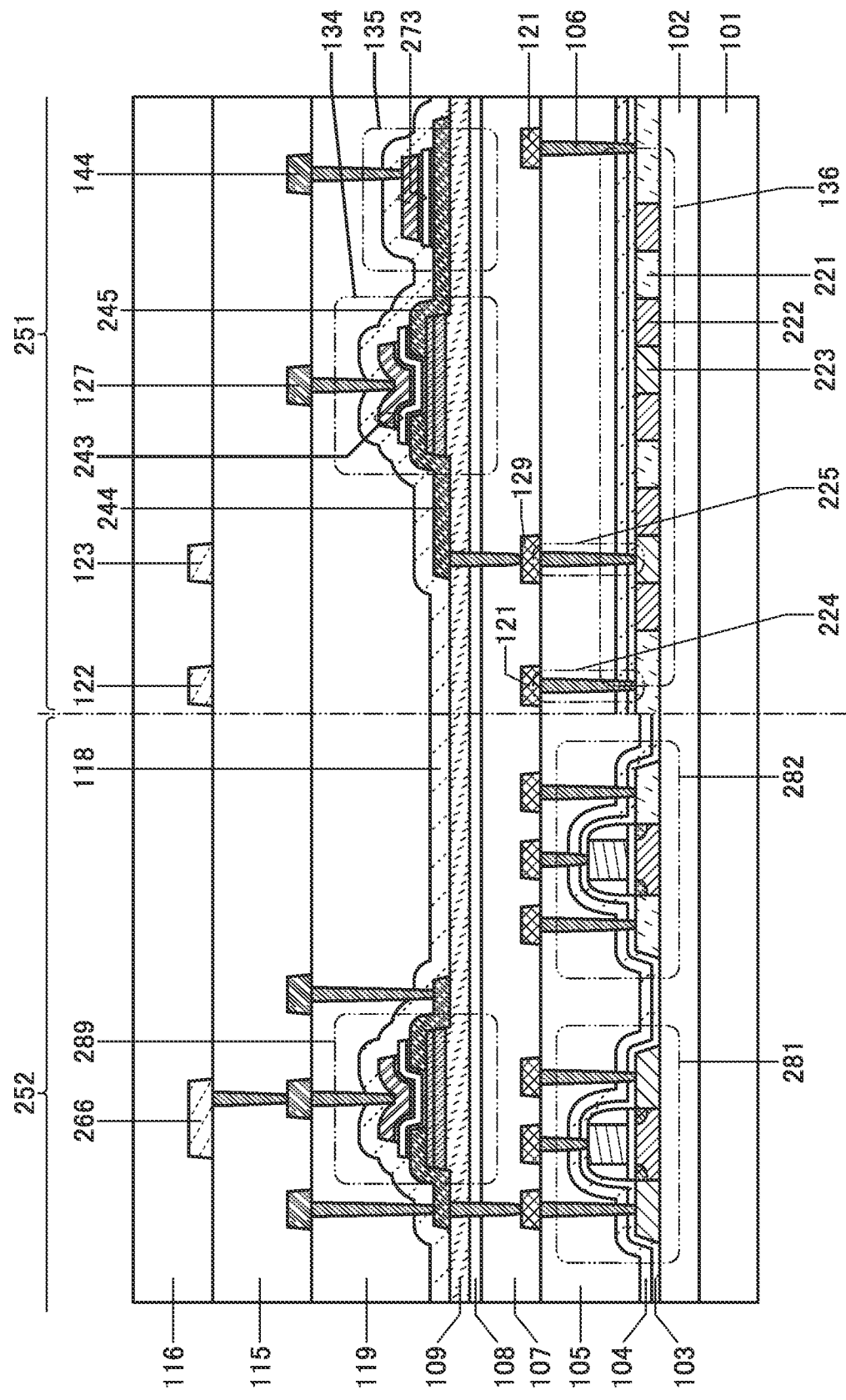
FIG. 11 A view illustrating a structure example of an imaging device.
Figure 12A:
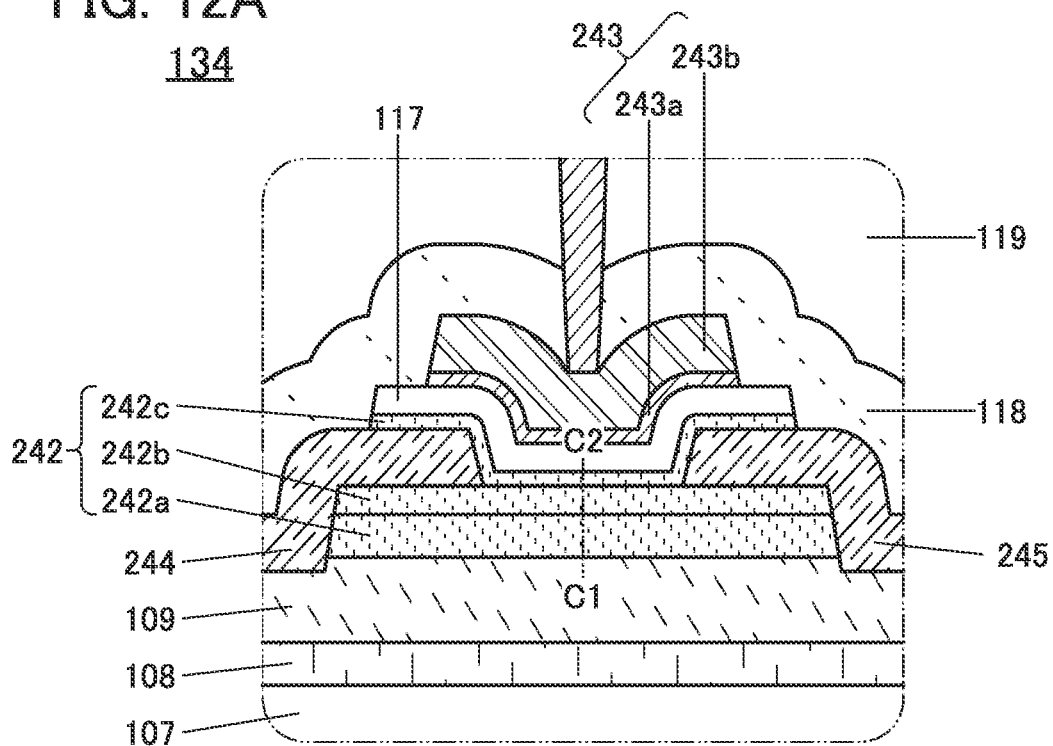
FIGS. 12A-12B Views illustrating an example of a transistor.
Figure 12B:
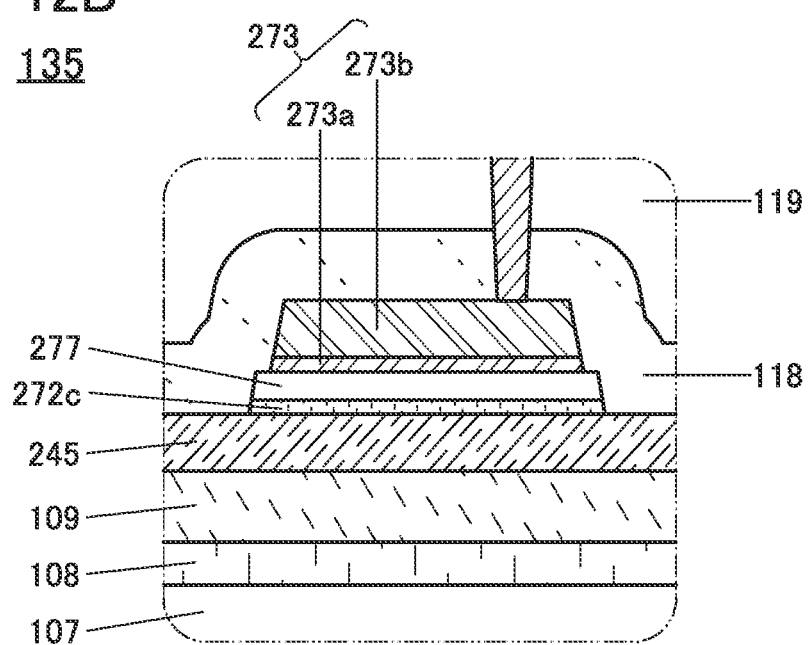
Figure 13:
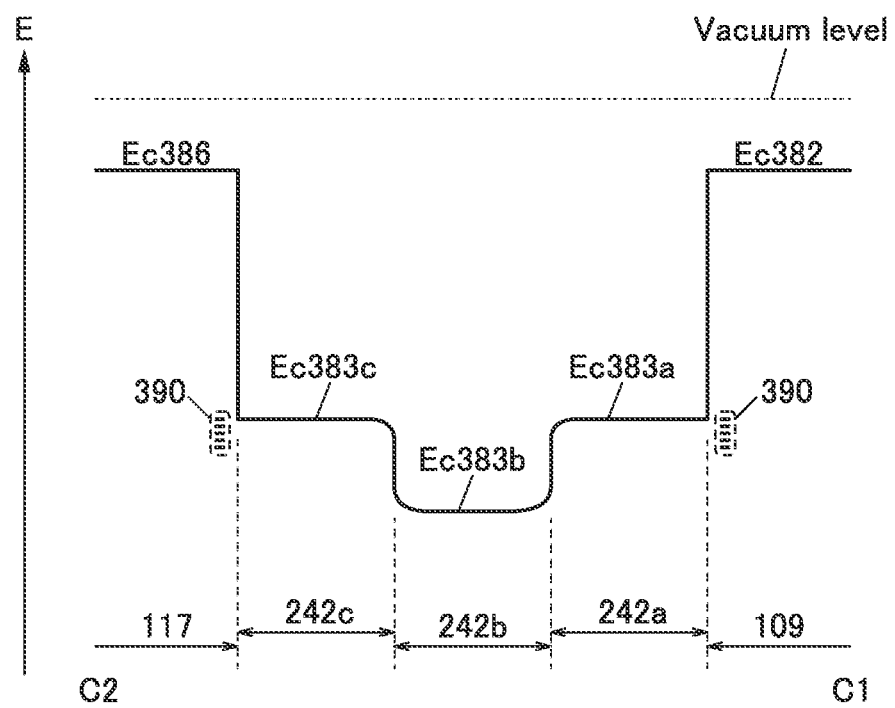
FIG. 13 A view illustrating an energy band structure.
Figure 14A:
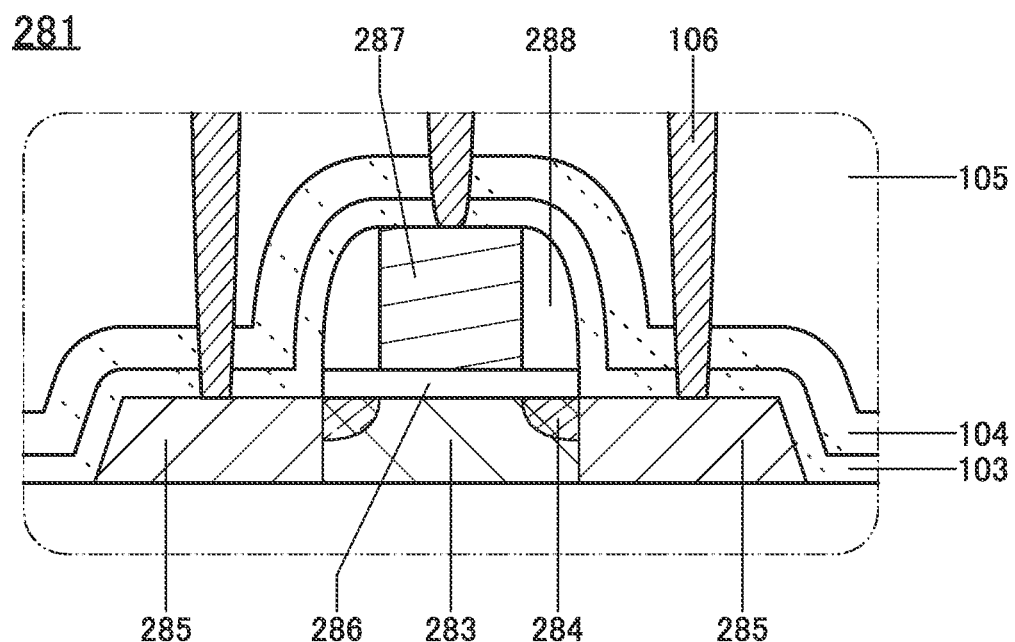
FIGS. 14A-14B Views illustrating examples of a transistor.
Figure 14B:
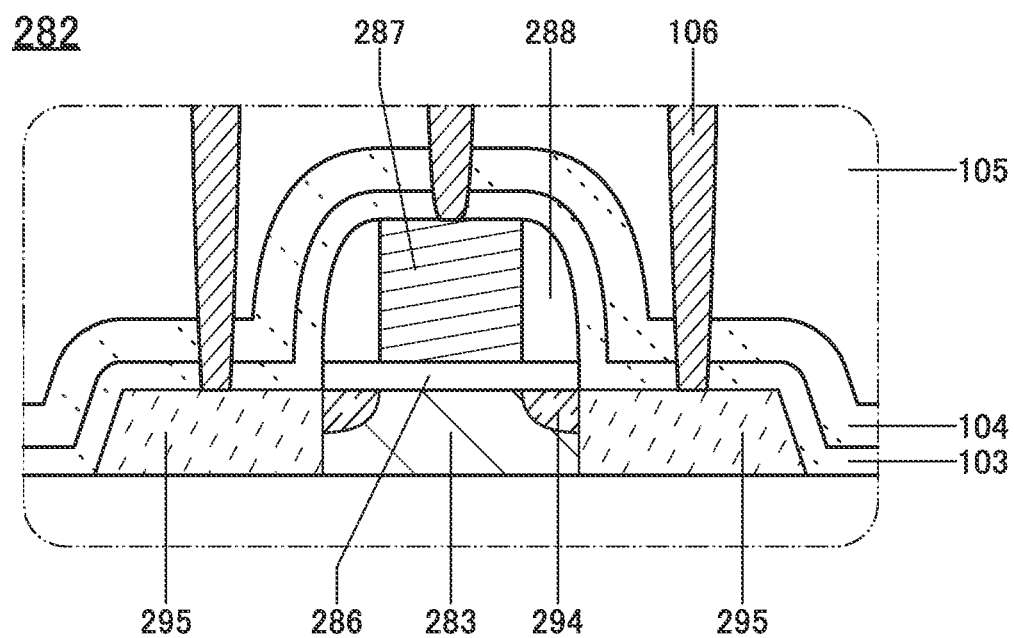

In this embodiment, an example of the case where the imaging device 100 described in the above embodiment is formed of a CMOS image sensor that is a type of solid-state imaging element will be described with reference to FIG. 11 to FIG. 15. A pixel region 251 shown in FIG. 11 is a cross-sectional view corresponds to part of the pixel 111 included in the imaging device 100. A peripheral circuit region 252 shown in FIG. 11 is a cross-sectional view corresponds to part of a peripheral circuit included in the imaging device 100. An enlarged view of a transistor 134 shown in FIG. 11 is illustrated in FIG. 12(A). An enlarged view of a capacitor 135 shown in FIG. 11 is illustrated in FIG. 12(B). In addition, an enlarged view of a transistor 281 shown in FIG. 11 is illustrated in FIG. 14(A). Furthermore, an enlarged view of a transistor 282 shown in FIG. 11 is illustrated in FIG. 14(B).

The imaging device 100 described in this embodiment includes an insulating layer 102 over a substrate 101, and a photoelectric conversion element 136 in which a pin junction is formed over the insulating layer 102. As described in the above embodiment, the photoelectric conversion element 136 includes the p-type semiconductor 221, the i-type semiconductor 222, and the n-type semiconductor 223.

As the substrate 101, a glass substrate, a quartz substrate, a sapphire substrate, a ceramic substrate, a metal substrate, a semiconductor substrate, or the like can be used. Alternatively, a plastic substrate having heat resistance to the processing temperature of this embodiment may be used. As an example of the substrate, there is a semiconductor substrate (e.g., a single crystal substrate or a silicon substrate), a SOI (SOI: Silicon on Insulator) substrate, a glass substrate, a quartz substrate, a plastic substrate, a metal substrate, a stainless steel substrate, a substrate including stainless steel foil, a tungsten substrate, or a substrate including tungsten foil. As an example of a glass substrate, there is barium borosilicate glass, aluminoborosilicate glass, soda lime glass, or the like.

In addition, after the photoelectric conversion element 136 and the pixel driver circuit 112 are formed, the substrate 101 may be removed by a mechanical polishing method, an etching method, or the like. If a material that can transmit light to be detected by the photoelectric conversion element 136 is used as the substrate 101, light can be incident on the photoelectric conversion element 136 from the substrate 101 side.

The insulating layer 102 can be formed as a single layer or a multilayer using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 102 can be formed by a sputtering method, a chemical vapor deposition (CVD) method, a thermal oxidation method, a coating method, a printing method, or the like.

Formation of the p-type semiconductor 221, the i-type semiconductor 222, and the n-type semiconductor 223 can be performed in the following manner: an island-shaped i-type semiconductor 222 is formed over the insulating layer 102, a mask is formed over the i-type semiconductor 222, and impurity elements are selectively introduced into part of the i-type semiconductor 222, for example. The impurity element can be introduced by an ion implantation method, an ion doping method, or the like, for example. The mask is removed after the impurity element is introduced.

The p-type semiconductor 221, the i-type semiconductor 222, and the n-type semiconductor 223 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon, microcrystalline germanium, or the like can be used. Alternatively, a compound semiconductor such as silicon carbide or gallium arsenide can be used.

In the case where silicon is used as a material for formation of the p-type semiconductor 221, the i-type semiconductor 222, and the n-type semiconductor 223, a Group 13 element can be used, for example, as a p-type impurity element. Furthermore, as an n-type impurity element, for example, a Group 15 element can be used.

In addition, in the case where the above semiconductor is formed using SOI, for example, the insulating layer 102 may be a BOX layer (BOX: Buried Oxide).

Moreover, the imaging device 100 described in this embodiment includes an insulating layer 103 and an insulating layer 104 over the p-type semiconductor 221, the i-type semiconductor 222, and the n-type semiconductor 223. The insulating layer 103 and the insulating layer 104 can be formed using a material and a method similar to those of the insulating layer 102. Note that either one, the insulating layer 103 or the insulating layer 104, may be omitted or another insulating layer may be stacked.

Furthermore, in the imaging device 100 described in this embodiment, an insulating layer 105 having a flat surface is formed over the insulating layer 104. The insulating layer 105 can be formed using a material and a method similar to those of the insulating layer 102. In addition, a low-dielectric constant material (a low-k material), a siloxane-based resin, PSG (phosphosilicate glass), BPSG (borophosphosilicate glass), or the like may be used for the insulating layer 105. Furthermore, the surface of the insulating layer 105 may be subjected to chemical mechanical polishing (CMP: Chemical Mechanical Polishing) treatment (hereinafter also referred to as "CMP treatment"). By performing the CMP treatment, unevenness of the surface of the sample can be reduced, and coverage with an insulating layer or a conductive layer formed later can be increased.

In addition, in a region including the insulating layer 103 to the insulating layer 105 which overlaps the p-type semiconductor 221, an opening 224 is formed. In a region including the insulating layer 103 to the insulating layer 105 which overlaps the n-type semiconductor 223, an opening 225 is formed. Furthermore, contact plugs 106 are formed in the opening 224 and the opening 225. The contact plugs 106 are formed by filling the openings provided in the insulating layers with a conductive material. As the conductive material, for example, a conductive material with high embeddability, such as tungsten, polysilicon, or the like, can be used. In addition, although not illustrated, the side surface and the bottom surface of the material can be covered with a barrier layer (a diffusion prevention layer) such as a titanium layer, a titanium nitride layer, or a stack of these layers. In this case, also a barrier film is included and regarded as the contact plug in some cases. Note that the opening 224 and the opening 225 are not particularly limited on their number or arrangement. Thus, an imaging device with high layout flexibility can be achieved.

Furthermore, a wiring 121 and a wiring 129 are formed over the insulating layer 105. The wiring 121 is electrically connected to the p-type semiconductor 221 via the contact plug 106 in the opening 224. In addition, the wiring 129 is electrically connected to the n-type semiconductor 223 via the contact plug 106 in the opening 225.

Moreover, an insulating layer 107 is formed to cover the wiring 121 and the wiring 129. The insulating layer 107 can be formed using a material and a method that are similar to those of the insulating layer 105. In addition, a surface of the insulating layer 107 may be subjected to CMP treatment. Performing the CMP treatment can reduce unevenness of the sample surface and increase coverage with an insulating layer or a conductive layer formed later.

For the wiring 121 and the wiring 129, a single-layer structure or a stacked-layer structure using single metals formed using aluminum, titanium, chromium, nickel, copper, yttrium, zirconium, molybdenum, manganese, silver, tantalum, and tungsten, or an alloy containing this as its main component. For example, a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, and an aluminum film or a copper film that overlaps with the titanium film or the titanium nitride film are stacked, and a titanium film or a titanium nitride film is further stacked overethere; a three-layer structure in which a molybdenum film or a molybdenum nitride film, and an aluminum film or a copper film that overlaps with the molybdenum film or the molybdenum nitride film are stacked, and a molybdenum film or a molybdenum nitride film is further stacked overthere; a three-layer structure in which a copper film is stacked over a tungsten film, and a tungsten film is further stacked overthere; and the like can be given. Alternatively, an alloy film or a nitride film in which aluminum and an element film or more selected from titanium, tantalum, tungsten, molybdenum, chromium, neodymium, and scandium are combined may be used.

Note that a conductive material containing oxygen such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen such as titanium nitride or tantalum nitride may be used. It is also possible to use a stacked-layer structure formed using a material containing the above metal element and conductive material containing oxygen in combination. It is also possible to use a stacked-layer structure formed using a material containing the above metal element and conductive material containing nitrogen in combination. It is also possible to use a stacked-layer structure formed using a material containing the above metal element, conductive material containing oxygen, and conductive material containing nitrogen in combination.

The transistor 134, a transistor 289, and the capacitor 135 are formed over the insulating layer 107 with an insulating layer 108 and an insulating layer 109 positioned therebetween. Although not shown in FIG. 11, the transistor 131, the transistor 132, the transistor 133, and the like are formed over the insulating layer 107 with the insulating layer 108 and the insulating layer 109 positioned therebetween. Note that, in this embodiment, the transistor 134 and the transistor 289 are illustrated as a top-gate structure transistor; however, a bottom-gate structure transistor may be employed. The same applies to the other transistors not shown in FIG. 11.

Alternatively, an inverted staggered transistor or a forward staggered transistor can also be used as the above transistors. In addition, it is also possible to use a dual-gate transistor, in which a semiconductor layer in which a channel is formed is interposed between two gate electrodes. Furthermore, the transistor is not limited to a transistor having a single-gate structure; a multi-gate transistor having a plurality of channel formation regions, for example, a double-gate transistor, may be used.

A transistor with a variety of structures such as a planar type, a FIN-type (a fin type), a TRI-GATE type (a tri-gate type), and the like can be used as the above transistors.

The above transistors may have the same structure or may have different structures. The size (e.g., channel length and channel width) or the like of the transistors may be adjusted as appropriate. In the case where all of the plurality of transistors included in the imaging device 100 have the same structure, the respective transistors can be formed concurrently in the same process.

The transistor 134 includes an electrode 243 that can function as a gate electrode, an electrode 244 that can function as one of a source electrode and a drain electrode, an electrode 245 that can function as the other of the source electrode and the drain electrode, an insulating layer 117 that can function as a gate insulating layer, and a semiconductor layer 242.

Note that, in FIG. 11, both the electrode 245 that functions as the other of the source electrode and the drain electrode of the transistor 134 and an electrode that can function as the one electrode of the capacitor 135 can be formed using the electrode 245. However, one embodiment of the present invention is not limited thereto. The electrode that functions as the other of the source electrode and the drain electrode of the transistor 134 and the electrode that can function as the one electrode of the capacitor 135 may be formed using different electrodes.

In addition, the capacitor 135 has a structure in which the electrode 245 that can function as the one electrode of the capacitor 135 and an electrode 273 that can function as the other electrode overlap with an insulating layer 277 and a semiconductor layer 272c positioned therebetween. Furthermore, the electrode 273 can be formed at the same time as the electrode 243. Moreover, the insulating layer 277 and the semiconductor layer 272c can function as a dielectric. In addition, the insulating layer 277 can be formed at the same time as an insulating layer 177. Furthermore, the semiconductor layer 272c can be formed at the same time as a semiconductor layer 242c. Note that one of the insulating layer 277 and the semiconductor layer 272c may be omitted.

The insulating layer 108 is preferably formed using an insulating film that has a function of preventing diffusion of impurities such as oxygen, hydrogen, water, alkali metal, alkaline earth metal, and the like. As the insulating film, there are silicon oxide, silicon oxynitride, silicon nitride, silicon nitride oxide, gallium oxide, hafnium oxide, yttrium oxide, aluminum oxide, aluminum oxynitride, and the like. Note that silicon nitride, gallium oxide, hafnium oxide, yttrium oxide, aluminum oxide, or the like is used as the insulating film, whereby impurities diffused from the photoelectric conversion element 136 side can be prevented from reaching the semiconductor layer 242. Note that the insulating layer 108 can be formed by a sputtering method, a CVD method, an evaporation method, a thermal oxidation method, or the like. The insulating layer 108 can be used as a single-layer structure or a stacked-layer structure of these materials.

The insulating layer 109 can be formed using a material and a method similar to those of the insulating layer 102. In addition, in the case where an oxide semiconductor is used for the semiconductor layer 242, the insulating layer 108 is preferably formed using an insulating layer containing oxygen in excess of oxygen that meets the stoichiometric composition. From the insulating layer containing oxygen in excess of oxygen that meets the stoichiometric composition, part of oxygen is released by heating. The insulating layer containing oxygen in excess of oxygen that meets the stoichiometric composition is an insulating layer of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis in which heat treatment is performed such that a temperature of a layer surface is higher than or equal to 100° C. and lower than or equal to 700° C., preferably higher than or equal to 100° C. and lower than or equal to 500° C.

In addition, the insulating layer containing oxygen in excess of oxygen that meets the stoichiometric composition can be formed by treatment for adding oxygen to the insulating layer. The treatment for adding oxygen can be performed by heat treatment under an oxygen atmosphere or with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. Note that, in this specification, the treatment for adding oxygen is also referred to as "oxygen doping treatment."

Semiconductor layers in the transistor 134, the transistor 289, and the like can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon, microcrystalline germanium, or the like can be used. Alternatively, a compound semiconductor such as silicon carbide, gallium arsenide, an oxide semiconductor, a nitride semiconductor, or the like, an organic semiconductor, or the like can be used.

In this embodiment, an example in which an oxide semiconductor is used for the semiconductor layer 242 is described. Furthermore, in this embodiment, a case where the semiconductor layer 242 is a stacked layer including a semiconductor layer 242a, a semiconductor layer 242b, and the semiconductor layer 242c is described.

The semiconductor layer 242a, the semiconductor layer 242b, and the semiconductor layer 242c are formed using a material containing either In or Ga or both of them. Typically, there are an In—Ga oxide (an oxide containing In and Ga), an In—Zn oxide (an oxide containing In and Zn), and an In-M-Zn oxide (an oxide containing In, an element M, and Zn: the element M is one or more kinds of elements selected from Al, Ti, Ga, Y, Zr, La, Ce, Nd, and Hf, and is a metal element whose strength of bonding with oxygen is higher than that of In).

The semiconductor layer 242a and the semiconductor layer 242c are preferably formed using a material containing one or more kinds of metal elements contained in the semiconductor layer 242b. With the use of such a material, interface states at an interface between the semiconductor layer 242a and the semiconductor layer 242b and an interface between the semiconductor layer 242c and the semiconductor layer 242b can be less likely to be generated. Accordingly, carriers are less likely to be scattered or captured at the interfaces, which results in an improvement in field-effect mobility of the transistor. Furthermore, threshold-voltage variation of the transistor can be reduced. Thus, a semiconductor device having favorable electrical characteristics can be achieved.

The thicknesses of the semiconductor layer 242a and the semiconductor layer 242c are greater than or equal to 3 nm and less than or equal to 100 nm, preferably greater than or equal to 3 nm and less than or equal to 50 nm. Furthermore, the thickness of the semiconductor layer 242b is greater than or equal to 3 nm and less than or equal to 200 nm, preferably greater than or equal to 3 nm and less than or equal to 100 nm, further preferably greater than or equal to 3 nm and less than or equal to 50 nm.

In addition, in the case where the semiconductor layer 242b is an In-M-Zn oxide and the semiconductor layer 242a and the semiconductor layer 242c are also an In-M-Zn oxide, the semiconductor layer 242a, the semiconductor layer 242c, and the semiconductor layer 242b are selected so that $y_1/x_1$ is larger than $y_2/x_2$, based on that the semiconductor layer 242a and the semiconductor layer 242c have InM:Zn=$x_1$:$y_1$:$z_1$ [atomic ratio], and the semiconductor layer 242b has InM:Zn=$x_2$:$y_2$:$z_2$, [atomic ratio]. It is preferable that the semiconductor layer 242a, the semiconductor layer 242c, and the semiconductor layer 242b are selected so that $y_1/x_1$ is 1.5 times or more as large as $y_2/x_2$. It is further preferable that the semiconductor layer 242a, the semiconductor layer 242c, and the semiconductor layer 242b are selected so that $y_1/x_1$ is twice or more as large as $y_2/x_2$. It is still further preferable that the semiconductor layer 242a, the semiconductor layer 242c, and the semiconductor layer 242b are selected so that $y_1/x_1$ is three times or more as large as $y_2/x_2$. At this time, $y_1$ is preferably greater than or equal to $x_1$ in the semiconductor layer 242b because stable electrical characteristics can be given to a transistor. However, when $y_1$ is three times or more as large as $x_1$, the field-effect mobility of the transistor is reduced; accordingly, $y_1$ is preferably smaller than three times $x_1$. When the semiconductor layer 242a and the semiconductor layer 242c have the above compositions, the semiconductor layer 242a and the semiconductor layer 242c can be a layer in which oxygen vacancies are less likely to be generated than in the semiconductor layer 242b.

Note that, in the case where the semiconductor layer 242a and the semiconductor layer 242c are an In-M-Zn oxide, the content percentages of In and an element M are preferably as follows: In is lower than 50 atomic % and an element M is higher than or equal to 50 atomic %. Further preferably, In is lower than 25 atomic % and an element M is higher than or equal to 75 atomic %. In addition, in the case where the semiconductor layer 242b is an In-M-Zn oxide, the content percentages of In and an element M, are preferably as follows: In is higher than or equal to 25 atomic % and an element M is lower than 75 atomic %. Further preferably, In is higher than or equal to 34 atomic % and an element M is lower than 66 atomic %.

For example, an In—Ga—Zn oxide which is formed using a target having an atomic ratio of In:Ga:Zn=1:3:2, 1:3:4, 1:3:6, 1:6:4, or 1:9:6, an In—Ga oxide which is formed using a target having an atomic ratio of In:Ga=1:9, gallium oxide, or the like can be used for the semiconductor layer 242a containing In or Ga and the semiconductor layer 242c containing In or Ga. Furthermore, an In—Ga—Zn oxide which is formed using a target having an atomic ratio of In:Ga:Zn=3:1:2, 1:1:1, 5:5:6, or 4:2:4.1 can be used for the semiconductor layer 242b. Note that the atomic ratio of each of the semiconductor layer 242a, and the semiconductor layer 242b may include a variation within a range of ±20% of the above-described atomic ratios as an error.

In order to give stable electrical characteristics to the transistor including the semiconductor layer 242b, it is preferable that impurities and oxygen vacancies in the semiconductor layer 242b be reduced to be highly purified; accordingly, the semiconductor layer 242b is changed into an oxide semiconductor layer that can be regarded to be intrinsic or substantially intrinsic. Furthermore, it is preferable that at least the channel formation region in the semiconductor layer 242b be a semiconductor layer that can be regarded to be intrinsic or substantially intrinsic.

Note that the oxide semiconductor layer that can be regarded to be substantially intrinsic refers to an oxide semiconductor layer in which the carrier density is lower than $1 \times 10^{17}/cm^3$, lower than $1 \times 10^{15}/cm^3$, or lower than $1 \times 10^{13}/cm^3$.

[Energy Band Structure of Oxide Semiconductor]

The function and effect of the semiconductor layer 242 that is formed of a stacked layer including the semiconductor layer 242a, the semiconductor layer 242b, and the semiconductor layer 242c will be described with an energy band structure diagram shown in FIG. 13. FIG. 13 is the energy band structure diagram of a portion indicated by dashed-dotted line C1-C2 in FIG. 12(A). FIG. 13 illustrates the energy band structure of a channel formation region of the transistor 134.

In FIG. 13, Ec382, Ec383a, Ec383b, Ec383c, and Ec386 indicate the energies of bottoms of the conduction band in the insulating layer 109, the semiconductor layer 242a, the semiconductor layer 242b, the semiconductor layer 242c, and the insulating layer 117, respectively.

Here, a difference in energy between the vacuum level and the bottom of the conduction band (also referred to as "electron affinity") corresponds to a value obtained by subtracting an energy gap from a difference in energy between the vacuum level and the top of the valence band (also referred to as an ionization potential). Note that the energy gap can be measured with a spectroscopic ellipsometer (HORIBA JOBIN YVON S.A.S. UT-300). In addition, the energy difference between the vacuum level and the top of the valence band can be measured using an ultraviolet photoelectron spectroscopy (UPS: Ultraviolet Photoelectron Spectroscopy) device (PHI, Inc. VersaProbe).

Note that an energy gap of an In—Ga—Zn oxide which is formed using a target having an atomic ratio of In:Ga:Zn=1:3:2 is approximately 3.5 eV and its electron affinity is approximately 4.5 eV. In addition, an energy gap of an In—Ga—Zn oxide which is formed using a target having an atomic ratio of In:Ga:Zn=1:3:4 is approximately 3.4 eV and its electron affinity is approximately 4.5 eV. In addition, an energy gap of an In—Ga—Zn oxide which is formed using a target having an atomic ratio of In:Ga:Zn=1:3:6 is approximately 3.3 eV and its electron affinity is approximately 4.5 eV. In addition, an energy gap of an In—Ga—Zn oxide which is formed using a target having an atomic ratio of In:Ga:Zn=1:6:2 is approximately 3.9 eV and its electron affinity is approximately 4.3 eV. In addition, an energy gap of an In—Ga—Zn oxide which is formed using a target having an atomic ratio of In:Ga:Zn=1:6:8 is approximately 3.5 eV and its electron affinity is approximately 4.4 eV. In addition, an energy gap of an In—Ga—Zn oxide which is formed using a target having an atomic ratio of In:Ga:Zn=1:6:10 is approximately 3.5 eV and its electron affinity is approximately 4.5 eV. In addition, an energy gap of an In—Ga—Zn oxide which is formed using a target having an atomic ratio of In:Ga:Zn=1:1:1 is approximately 3.2 eV and its electron affinity is approximately 4.7 eV. In addition, an energy gap of an In—Ga—Zn oxide which is formed using a target having an atomic ratio of In:Ga:Zn=3:1:2 is approximately 2.8 eV and its electron affinity of approximately 5.0 eV.

Since the insulating layer 109 and the insulating layer 117 are insulators, Ec382 and Ec386 are closer to the vacuum level (have a smaller electron affinity) than Ec383a, Ec383b, and Ec383c.

Furthermore, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Furthermore, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Furthermore, in the vicinity of an interface between the semiconductor layer 242a and the semiconductor layer 242b and the vicinity of an interface between the semiconductor layer 242b and the semiconductor layer 242c, mixed regions are formed; thus, the energy of the bottom of the conduction band continuously changes. In other words, no state or few states exist at these interfaces.

Accordingly, electrons transfer mainly through the semiconductor layer 242b in the stacked-layer structure having the energy band structure. Therefore, even when a state exists at an interface between the semiconductor layer 242a and the insulating layer 107 or an interface between the semiconductor layer 242c and the insulating layer 117, the state hardly influences the transfer of the electrons. In addition, the state does not exist or hardly exists at the interface between the semiconductor layer 242a and the semiconductor layer 242b and at the interface between the semiconductor layer 242c and the semiconductor layer 242b; thus, transfer of electrons are not prohibited in the region. Accordingly, high field-effect mobility can be achieved in the transistor 134 having the above stacked-layer structure of the oxide semiconductor layers.

Note that although trap states 390 due to impurities or defects might be formed in the vicinity of the interface between the semiconductor layer 242a and the insulating layer 109 and the interface between the semiconductor layer 242c and the insulating layer 117 as shown in FIG. 13, the semiconductor layer 242b can be separated from the trap states owing to the existence of the semiconductor layer 242a and the semiconductor layer 242c.

In particular, the transistor 134 illustrated in this embodiment is formed so that an upper surface and a side surface of the semiconductor layer 242b are in contact with the semiconductor layer 242c, and a bottom surface of the semiconductor layer 242b is in contact with the semiconductor layer 242a. In this manner, the structure in which the semiconductor layer 242b is surrounded by the semiconductor layer 242a and the semiconductor layer 242c can further reduce the influence of the above trap state.

However, in the case where an energy difference between Ec383a or Ec383c and Ec383b is small, electrons in the semiconductor layer 242b reach the trap states by passing over the energy difference in some cases. The electrons are trapped by the trap states, which generates a negative fixed electric charge at the interface with the insulating layer, causing the threshold voltage of the transistor to be shifted in the positive direction.

Therefore, each of the energy differences between Ec383a and Ec383c, and Ec383b is preferably set to be larger than or equal to 0.1 eV, further preferably larger than or equal to 0.15 eV, in which case a change in the threshold voltage of the transistor can be reduced and electrical characteristics of the transistor can be favorable.

In addition, the band gaps of the semiconductor layer 242a and the semiconductor layer 242c is preferably larger than the band gap of the semiconductor layer 242b.

According to one embodiment of the present invention, a transistor with a small variation in electrical characteristics can be achieved. Accordingly, a semiconductor device with a small variation in electrical characteristics can be achieved. According to one embodiment of the present invention, a transistor with high reliability can be achieved. Accordingly, a semiconductor device with high reliability can be achieved.

In addition, a band gap of an oxide semiconductor is 2 eV or more; therefore, a transistor that includes an oxide semiconductor in its semiconductor layer in which a channel is formed has an extremely small off-state current. Specifically, the off-state current per micrometer of channel width under room temperature can be lower than $1 \times 10^{-20}$ A, preferably lower than $1 \times 10^{-22}$ A, further preferably lower than $1 \times 10^{-24}$ A. That is, the on/off ratio can be greater than or equal to 20 digits and less than or equal to 150 digits.

According to one embodiment of the present invention, a transistor with small power consumption can be achieved. Accordingly, an imaging device or a semiconductor device with low power consumption can be achieved.

In addition, a transistor that includes an oxide semiconductor in its semiconductor layer (also referred to as "OS transistor") has a very low off-state current. Thus, the use of OS transistors as the transistor 133 and the transistor 134 can make the capacitor 135 smaller. Alternatively, parasitic capacitance of a transistor and the like can be used as a substitute for the capacitor 135, without providing the capacitor 135. In this way, the light-receivable area of the photoelectric conversion element 136 can be increased.

According to one embodiment of the present invention, an imaging device or a semiconductor device with high light receiving sensitivity can be achieved. Furthermore, according to one embodiment of the present invention, an imaging device or a semiconductor device with a wide dynamic range can be achieved.

Furthermore, since an oxide semiconductor has a wide bandgap, a semiconductor device including an oxide semiconductor can be used in a wide range of ambient temperature. According to one embodiment of the present invention, an imaging device or a semiconductor device with a wide temperature range for operation can be achieved.

Note that the above-described three-layer structure is an example. For example, a two-layer structure without either one of the semiconductor layer 242a and the semiconductor layer 242c may be employed.

[As for Oxide Semiconductor]

Here, an oxide semiconductor film can be used for the semiconductor layer 242 will be described in detail.

Oxide semiconductor films are classified roughly into single-crystal oxide semiconductor films and non-single-crystal oxide semiconductor films. The non-single-crystal oxide semiconductor film refers to a CAAC-OS (C Axis Aligned Crystalline Oxide Semiconductor) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

With a transmission electron microscope (TEM: Transmission Electron Microscope), a combined analysis image (also referred to as a high-resolution TEM image) of a bright-field image and a diffraction pattern of the CAAC-OS film is observed, and a plurality of crystal parts can be observed. However, even in the high-resolution TEM image, a clear boundary between crystal parts, that is, a grain boundary (also referred to as a grain boundary) cannot be observed. Thus, it can be said that, in the CAAC-OS film, a reduction in electron mobility due to the grain boundary is less likely to occur.

According to the high-resolution cross-sectional TEM image of the CAAC-OS film observed in a direction substantially parallel to a sample surface, it can be seen that metal atoms are arranged in a layered manner in the crystal parts. Each metal atom layer has a form reflecting unevenness of a surface over which the film is formed (also referred to as a formation surface) or a top surface of the CAAC-OS film, and is arranged parallel to the formation surface or the top surface of the CAAC-OS film.

Meanwhile, according to the high-resolution plan-view TEM image of the CAAC-OS film observed in a direction substantially perpendicular to the sample surface, it can be seen that metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD: X-Ray Diffraction) apparatus; for example, when the CAAC-OS film including an $InGaZnO_4$ crystal is analyzed by an out-of-plane method, a peak of 2θ appears frequently at around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface.

Note that when the CAAC-OS film including an $InGaZnO_4$ crystal is analyzed by an out-of-plane method, a peak of 2θ is also observed at around 36° in some cases, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, a transition metal element, or the like. In particular, an element that has higher bonding strength to oxygen than a metal element included in the oxide semiconductor film, such as silicon or the like, disturbs the atomic arrangement of the oxide semiconductor film by depriving the oxide semiconductor film of oxygen and causes a decrease in crystallinity. Furthermore, a heavy metal such as iron, nickel, or the like, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor film serves as a carrier trap or a carrier generation source in some cases.

In addition, the CAAC-OS film is an oxide semiconductor film having a low density of defect states. In some cases, oxygen vacancies in the oxide semiconductor film serve as carrier traps or serve as carrier generation sources when hydrogen is captured therein, for example.

The state in which impurity concentration is low and density of defect states is low (the number of oxygen vacancies is small) is referred to as being highly purified intrinsic or substantially highly purified intrinsic. A highly purified intrinsic or substantially highly purified intrinsic oxide semiconductor film has few carrier generation sources, and thus can have a low carrier density. Thus, a transistor using the oxide semiconductor film rarely has an electrical characteristics in which the threshold voltage is negative (also referred to as being normally on). Furthermore, the highly purified intrinsic or substantially highly purified intrinsic oxide semiconductor film has few carrier traps. Accordingly, the transistor including the oxide semiconductor film becomes a transistor having little variation in electrical characteristics and high reliability. Note that an electric charge trapped by the carrier traps in the oxide semiconductor film takes a long time to be released, and behaves like a fixed electric charge in some cases. Thus, the transistor that includes the oxide semiconductor film having high impurity concentration and a high density of defect states has unstable electrical characteristics in some cases.

In addition, a transistor using the CAAC-OS film has a small variation in the electrical characteristics due to irradiation with visible light or ultraviolet light.

Next, a microcrystalline oxide semiconductor film will be described.

A microcrystalline oxide semiconductor film has a region where a crystal part can be observed in a high resolution TEM image and a region where a clear crystal part cannot be observed. In most cases, a crystal part included in the microcrystalline oxide semiconductor film is greater than or equal to 1 nm and less than or equal to 100 nm, or greater than or equal to 1 nm and less than or equal to 10 nm. An oxide semiconductor film including nanocrystal (nc: nanocrystal) that is a microcrystal with a size greater than or equal to 1 nm and less than or equal to 10 nm, or a size greater than or equal to 1 nm and less than or equal to 3 nm is specifically referred to as an nc-OS (nanocrystalline Oxide Semiconductor) film. In addition, in a high resolution TEM image, for example, a grain boundary cannot be observed clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. In addition, there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis which is out-of-plane method analysis with an XRD apparatus using an X-ray having a diameter larger than that of a crystal part, a peak which shows a crystal plane does not appear. Furthermore, a diffraction pattern like a halo pattern is observed when the nc-OS film is subjected to electron diffraction (also referred to as selected-area electron diffraction) using an electron beam having a probe diameter (e.g., larger than or equal to 50 nm) larger than the diameter of a crystal part. Meanwhile, spots are observed when the nc-OS film is subjected to nanobeam electron diffraction using an electron beam having a probe diameter close to, or smaller than the diameter of a crystal part. Furthermore, when the nc-OS film is subjected to nanobeam electron diffraction, regions with high luminance drawing a circle (like a ring) are observed in some cases. Also when the nc-OS film is subjected to nanobeam electron diffraction, a plurality of spots are observed in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film.

Next, an amorphous oxide semiconductor film will be described.

The amorphous oxide semiconductor film is an oxide semiconductor film in which its atomic arrangement is disordered and a crystal part is not included. An oxide semiconductor film including an amorphous state like in quartz is an example.

In the high-resolution TEM image of the amorphous oxide semiconductor film, crystal parts cannot be observed.

When the amorphous oxide semiconductor film is subjected to structural analysis which is out-of-plane method analysis with an XRD apparatus, a peak which shows a crystal plane is not detected. In addition, a halo pattern is observed when the amorphous oxide semiconductor film is subjected to electron diffraction. Furthermore, a halo pattern is observed but a spot is not observed when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS: amorphous-like Oxide Semiconductor) film.

In a high-resolution TEM image of the a-like OS film, a void (also referred to as a void) is observed in some cases. Furthermore, in the high-resolution TEM image, a region where a crystal part can be clearly observed and a region where a crystal part cannot be observed are included. When the a-like OS film is irradiated with a slight amount of electron beam used enough for TEM observation, crystallization occurs and growth of the crystal part is seen sometimes. In contrast, crystallization by irradiation of a slight amount of electron beam used enough for TEM observation is hardly seen in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are totally layered in the c-axis direction. Accordingly, the spacing between these adjacent layers is equivalent to the lattice spacing on the (009) plane (also referred to as d value). The value is calculated to 0.29 nm from crystal structure analysis. Thus, focusing on lattice fringes in the high-resolution TEM image, each of lattice fringes in which the lattice fringes therebetween is greater than or equal to 0.28 nm and less than or equal to 0.30 nm corresponds to the a-b plane of the $InGaZnO_4$ crystal.

In addition, the density of an oxide semiconductor film might vary depending on its structure. For example, if the composition of an oxide semiconductor film is determined, the structure of the oxide semiconductor film can be estimated from a comparison with the density of a single crystal having the same composition as its composition. For example, the density of the a-like OS film is higher than or equal to 78.6% and lower than 92.3% of the density of the single crystal. For further example, the density of the nc-OS film and the density of the CAAC-OS film are higher than or equal to 92.3% and lower than 100%. Note deposition itself of an oxide semiconductor film whose density is lower than 78% of the density of the single crystals difficult.

The above description will be explained with reference to specific examples. For example, for an oxide semiconductor film with In:Ga:Zn=1:1:1 [atomic ratio], the density of single-crystal $InGaZnO_4$ with a rhombohedral crystal structure is 6.357 $g/cm^3$. Thus, for example, for the oxide semiconductor film with In:Ga:Zn=1:1:1 [atomic ratio], the density of an a-like OS film is higher than or equal to 5.0 $g/cm^3$ and lower than 5.9 $g/cm^3$. In addition, for example, for the oxide semiconductor film with In:Ga:Zn=1:1:1 [atomic ratio], the density of an nc-OS film and the density of a CAAC-OS film are higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to a single crystal with a desired composition. The density of the single crystal with a desired composition may be calculated using weighted average with respect to the combination ratio of the single crystals with different compositions. Note that it is preferable to combine as few kinds of single crystals as possible to calculate the density.

Note that an oxide semiconductor film may be a stacked film including two or more kinds of an amorphous oxide semiconductor film, an a-like OS film, a microcrystalline oxide semiconductor film, and a CAAC-OS film, for example.

Now, even when the oxide semiconductor film is a CAAC-OS film, a diffraction pattern similar to that of an nc-OS film or the like is partly observed in some cases. Therefore, whether or not a CAAC-OS film is favorable can be represented by the proportion of a region where a diffraction pattern of a CAAC-OS film is observed in a predetermined area (also referred to as proportion of CAAC). For a high quality CAAC-OS film, for example, the proportion of CAAC is higher than or equal to 50%, preferably higher than or equal to 80%, further preferably higher than or equal to 90%, still further preferably higher than or equal to 95%. Note that a region where a diffraction pattern different from that of a CAAC-OS film is observed is written as the proportion of non-CAAC.

As an example of an oxide semiconductor that can be used for the semiconductor layer 242a, the semiconductor layer 242b, and the semiconductor layer 108c, an oxide containing indium can be given. An oxide can have a high carrier mobility (electron mobility) by containing indium, for example. In addition, an oxide semiconductor preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, magnesium, and the like. Note that a plurality of the above elements may be used in combination as the element M. The element M is an element having a high bonding energy with oxygen, for example. The element M is an element having a function of increasing the energy gap of the oxide, for example. Furthermore, the oxide semiconductor preferably contains zinc. When the oxide contains zinc, the oxide is easily to be crystallized, for example.

Note that the oxide semiconductor is not limited to the oxide containing indium. The oxide semiconductor may be, for example, zinc tin oxide, gallium tin oxide, or gallium oxide.

Furthermore, for the oxide semiconductor, an oxide with a wide energy gap is used. For example, the energy gap of the oxide semiconductor is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

Influence of impurities in the oxide semiconductor will be described below. Note that, in order to stabilize electrical characteristics of a transistor, it is effective to reduce the concentration of impurities in the oxide semiconductor to have lower carrier density and to be highly purified. Note that the carrier density of the oxide semiconductor is set to be lower than $1 \times 10^{17}/cm^3$, lower than $1 \times 10^{15}/cm^3$, or lower than $1 \times 10^{13}/cm^3$. In order to reduce the concentration of impurities in the oxide semiconductor, the concentration of impurities in an adjacent film is preferably reduced.

For example, silicon in the oxide semiconductor serves as a carrier trap or a carrier generation source in some cases. Therefore, the silicon concentration in the oxide semiconductor measured by secondary ion mass spectrometry (SIMS: Secondary Ion Mass Spectrometry) is lower than $1 \times 10^{19}$ atoms/cm$^3$, preferably lower than $5 \times 10^{18}$ atoms/cm$^3$, further preferably lower than $2 \times 10^{18}$ atoms/cm$^3$.

Furthermore, when hydrogen is contained in the oxide semiconductor, the carrier density is increased in some cases. The concentration of hydrogen in the oxide semiconductor, which is measured by SIMS, can be set to lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. In addition, when nitrogen is contained in the oxide semiconductor, the carrier density is increased in some cases. The concentration of nitrogen in the oxide semiconductor measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In addition, in order to reduce the hydrogen concentration in the oxide semiconductor, the hydrogen concentrations in the insulating layer 109 and the insulating layer 117 that are in contact with the semiconductor layer 242 are preferably reduced. The hydrogen concentration in the insulating layer 109 and the insulating layer 117 measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. In addition, in order to reduce the nitrogen concentration in the oxide semiconductor, the nitrogen concentrations in the insulating layer 109 and the insulating layer 117 are preferably reduced. The nitrogen concentration in the insulating layer 109 and the insulating layer 117 measured by SIMS is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In this embodiment, first, the semiconductor layer 242a is formed over the insulating layer 109, and the semiconductor layer 242b is formed over the semiconductor layer 242a.

Note that a sputtering method is preferably used for deposition of the oxide semiconductor layers. As a sputtering method, an RF sputtering method, a DC sputtering method, an AC sputtering method, or the like can be used. A DC sputtering method or an AC sputtering method can achieve uniform deposition as compared to an RF sputtering method.

In this embodiment, as the semiconductor layer 242a, 20-nm-thick In—Ga—Zn oxide is deposited by a sputtering method using an In—Ga—Zn oxide target (In:Ga:Zn=1:3:2). Note that the constituent elements and compositions applicable to the semiconductor layer 242a are not limited thereto.

In addition, the oxygen doping treatment may be performed after the formation of the semiconductor layer 242a.

Next, the semiconductor layer 242b is formed over the semiconductor layer 242a. In this embodiment, as the semiconductor layer 242b, 30-nm-thick In—Ga—Zn oxide is deposited by a sputtering method using an In—Ga—Zn oxide target (In:Ga:Zn=1:1:1). Note that the constituent elements and compositions applicable to the semiconductor layer 242b are not limited thereto.

In addition, the oxygen doping treatment may be performed after the formation of the semiconductor layer 242b.

Next, heat treatment may be performed to further reduce the impurities such as moisture or hydrogen contained in the semiconductor layer 242a and the semiconductor layer 242b, so that the semiconductor layer 242a and the semiconductor layer 242b are highly purified.

For example, the semiconductor layer 242a and the semiconductor layer 242b are subjected to heat treatment in a reduced-pressure atmosphere, in an inert atmosphere of nitrogen, a rare gas, or the like, in an oxidation atmosphere, or in an ultra dry air (air whose moisture amount is 20 ppm (−55° C. by conversion into a dew point) or less, preferably 1 ppm or less, preferably 10 ppb or less, in the case where the measurement is performed using a dew point meter in a CRDS (cavity ring down laser spectroscopy) system) atmosphere. Note that the oxidation atmosphere refers to an atmosphere including an oxidation gas such as oxygen, ozone, nitrogen oxide, or the like at 10 ppm or higher. Furthermore, the inert atmosphere refers to an atmosphere including the aforementioned oxidation gas at lower than 10 ppm and is filled with nitrogen or a rare gas.

In addition, by heat treatment performed, oxygen included in the insulating layer 109 can be diffused into the semiconductor layer 242a and the semiconductor layer 242b, concurrently with the release of impurities, so that oxygen vacancies in the semiconductor layer 242a and the semiconductor layer 242b can be reduced. Note that, after heat treatment is performed in an inert gas atmosphere, heat treatment may be performed in an atmosphere containing an oxidation gas at 10 ppm or more, 1% or more, or 10% or more. Note that the heat treatment may be performed at any time after the semiconductor layer 242b is formed. For example, the heat treatment may be performed after the semiconductor layer 242b is selectively etched.

The heat treatment can be performed at higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because reduction in the productivity is caused.

Next, a resist mask is formed over the semiconductor layer 242b, and with the use of the resist mask, parts of the semiconductor layer 242a and the semiconductor layer 242b are selectively etched. At this time, the insulating layer 109 might be partly etched, and a projection is formed on the insulating layer 109 in some cases.

For etching of the semiconductor layer 242a and the semiconductor layer 242b, either a dry etching method or a wet etching method may be acceptable, or both may be used. After the etching is terminated, the resist mask is removed.

In addition, the transistor 134 includes the electrode 244 and the electrode 245 that are in contact with part of the semiconductor layer 242b over the semiconductor layer 242b. The electrode 244 and the electrode 245 (including another electrode or wiring that is formed in the same layer as these) can be formed using a material and a method similar to those of the wiring 121.

In addition, the transistor 134 includes the semiconductor layer 242c over the semiconductor layer 242b, the electrode 244, and the electrode 245. The semiconductor layer 242c is in contact with part of each of the semiconductor layer 242b, the electrode 244, and the electrode 245.

In this embodiment, the semiconductor layer 242c is formed by a sputtering method using an In—Ga—Zn oxide target (In:Ga:Zn=1:3:2). Note that the constituent elements and compositions applicable to the semiconductor layer 242c are not limited thereto. For example, oxide gallium may be used for the semiconductor layer 242c. Furthermore, the oxygen doping treatment may be performed on the semiconductor layer 242c.

Furthermore, the transistor 241 includes the insulating layer 117 over the semiconductor layer 242c. The insulating layer 117 can function as a gate insulating layer. The insulating layer 117 can be formed using a material and a method similar to those of the insulating layer 102. Furthermore, the oxygen doping treatment may be performed on the insulating layer 117.

After the semiconductor layer 242c and the insulating layer 117 are formed, a mask is formed over the insulating layer 117, and parts of the semiconductor layer 242c and the insulating layer 117 are selectively etched, so that an island-shaped semiconductor layer 242c and an island-shaped insulating layer 117 may be formed.

Moreover, the transistor 134 includes the electrode 243 over the insulating layer 117. The electrode 243 (including another electrode or wiring that is formed in the same layer as these) can be formed using a material and a method similar to those of the wiring 121.

In this embodiment, an example in which the electrode 243 is a stacked layer including an electrode 243a and an electrode 243b is shown. For example, the electrode 243a is formed using tantalum nitride, and the electrode 243b is formed using copper. The electrode 243a functions as a barrier layer to prevent diffusion of copper elements. Thus, a semiconductor device with high reliability can be achieved.

Moreover, the transistor 241 includes an insulating layer 118 covering the electrode 243. The insulating layer 118 can be formed using a material and a method similar to those of the insulating layer 102. In addition, the insulating layer 118 may be subjected to oxygen doping treatment. Furthermore, a surface of the insulating layer 118 may be subjected to CMP treatment.

In addition, an insulating layer 119 is included over the insulating layer 118. The insulating layer 119 can be formed using a material and a method that are similar to those of the insulating layer 105. Furthermore, a surface of the insulating layer 119 may be subjected to CMP treatment. By performing the CMP treatment, unevenness of the surface of the sample can be reduced, and coverage with an insulating layer or a conductive layer formed later can be increased. In addition, an opening is formed in parts of the insulating layer 119 and the insulating layer 118. Furthermore, a contact plug is formed in the opening.

In addition, a wiring 127 and a wiring 144 (including another electrode or wiring that is formed in the same layer as these) are formed over the insulating layer 119. The wiring 144 is electrically connected to the electrode 273 via the contact plug in the opening provided through the insulating layer 119 and the insulating layer 118. Moreover, the wiring 127 is electrically connected to the electrode 243 via the contact plug in the opening provided through the insulating layer 119 and the insulating layer 118.

In addition, the imaging device 100 includes an insulating layer 115 to cover the wiring 127 and the wiring 144 (including another electrode or wiring formed in the same layer as these). The insulating layer 115 can be formed using a material and a method similar to those of the insulating layer 105. In addition, a surface of the insulating layer 115 may be subjected to CMP treatment. By performing the CMP treatment, unevenness of the surface of the sample can be reduced, and coverage with an insulating layer or a conductive layer formed later can be increased. In addition, an opening is formed in part of the insulating layer 115.

Furthermore, the wiring 122, the wiring 123, and the wiring 266 (including another electrode or wiring that is formed in the same layer as these) are formed over the insulating layer 115.

Note that each of the wiring 122, the wiring 123, and the wiring 266 (including another electrode or wiring formed in the same layer as these) can be electrically connected to a wiring of another layer or an electrode of another layer via an opening and a contact plug formed through the insulating layer.

Furthermore, an insulating layer 116 is included to cover the wiring 122, the wiring 123, and the wiring 266. The insulating layer 116 can be formed using a material and a method similar to those of the insulating layer 105. In addition, a surface of the insulating layer 116 may be subjected to CMP treatment.

An enlarged cross-sectional view of the transistor 281 illustrated in FIG. 11 is illustrated in FIG. 14(A) as an example of a transistor included in a peripheral circuit. In addition, an enlarged cross-sectional view of the transistor 282 illustrated in FIG. 11 is illustrated in FIG. 14(B). In this embodiment, the case where the transistor 281 is a p-channel transistor and the transistor 282 is an n-channel transistor is described as an example.

The transistor 281 includes an i-type semiconductor 283 in which a channel is formed, p-type semiconductors 285, an insulating layer 286, an electrode 287, and sidewalls 288. In addition, at regions overlapping with the sidewalls 288 in the i-type semiconductor 283, low-concentration p-type impurity regions 284 are provided.

The i-type semiconductor 283 included in the transistor 281 can be formed concurrently in the same step as that of the i-type semiconductor 222 included in the photoelectric conversion element 136. In addition, the p-type semiconductor 285 included in the transistor 281 can be formed concurrently in the same step as that of the p-type semiconductor 221 included in the photoelectric conversion element 136.

The insulating layer 286 can function as a gate insulating layer. In addition, the electrode 287 can function as a gate electrode. The low-concentration p-type impurity regions 284 can be formed in such a manner that an impurity element is introduced with the use of the electrode 287 as a mask after formation of the electrode 287 and before the formation of the sidewalls 288. In other words, the low-concentration p-type impurity regions 284 can be formed in a self-aligned manner. Note that the low-concentration p-type impurity regions 284 have the same conductivity type as that of the p-type semiconductor 285, and lower concentration of impurities imparting the conductivity type than the p-type semiconductor 285.

The transistor 282 has a structure similar to that of the transistor 281; however, there is a difference in that low-concentration n-type impurity regions 294 and an n-type semiconductor 295 are provided, instead of the low-concentration p-type impurity regions 284 and the p-type semiconductor 285.

In addition, the n-type semiconductor 295 included in the transistor 282 can be formed concurrently in the same step as that of the n-type semiconductor 223 included in the photoelectric conversion element 136. In addition, the low-concentration n-type impurity regions 294 as well as the transistor 281 can be formed in a self-aligned manner. Note that the low-concentration n-type impurity regions 294 have the same conductivity type as that of the n-type semiconductor 295 and lower concentration of impurities imparting the conductivity type than the n-type semiconductor 295.

Note that although the variety of films such as the metal film, the semiconductor film, the inorganic insulating film, and the like which have been disclosed in this specification and the like can be formed by a sputtering method or a plasma CVD method, such films may be formed by another method, for example, a thermal CVD (Chemical Vapor Deposition) method. A MOCVD (Metal Organic Chemical Vapor Deposition) method or an ALD (Atomic Layer Deposition) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied at a time to the chamber, in which the pressure is set to an atmospheric pressure or a reduced pressure, and react with each other in the vicinity of the substrate or over the substrate.

In addition, deposition by an ALD method may be performed in such a manner that source gases for reaction are sequentially introduced into the chamber, in which the pressure is set to an atmospheric pressure or a reduced pressure, and then the sequence of the gas introduction is repeated. For example, two or more kinds of source gases are sequentially supplied to the chamber by switching respective switching valves (also referred to as high-speed valves), an inert gas (argon, nitrogen, or the like) or the like is introduced at the same time as or after the introduction of the first gas so that a plurality of kinds of the source gases are not mixed, and then a second source gas is introduced. Note that in the case where the inert gas is introduced concurrently, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer, which reacts the second source gas introduced subsequently, and a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a film thickness and thus is suitable for the case of fabricating a minute FET (Field Effect Transistor).

The variety of films such as the metal film, the semiconductor film, the inorganic insulating film, and the like which have been disclosed in the above described embodiments can be formed by a thermal CVD method such as a MOCVD method, an ALD method, or the like. For example, when an In—Ga—Zn—O film is formed, trimethylindium, trimethylgallium, and dimethylzinc are used. Note that the chemical formula of trimethylindium is $In(CH_3)_3$. In addition, the chemical formula of trimethylindium is $Ga(CH_3)_3$. Furthermore, the chemical formula of dimethylzinc is $Zn(CH_3)_2$. Moreover, without limitation to the above combination, triethylgallium (chemical formula: $Ga(C_2H_5)_3$) can also be used instead of trimethylgallium, and diethylzinc (chemical formula: $Zn(C_2H_5)_2$) can also be used instead of dimethylzinc.

For example, in the case where a hafnium oxide film is formed with a deposition apparatus employing ALD, two kinds of gases, i.e., a source gas which is obtained by vaporizing liquid containing a solvent and a hafnium precursor compound (hafnium alkoxide solution, typically tetrakis(dimethylamide)hafnium (TDMAH)) and ozone ($O_3$) as an oxidizer are used. Note that the chemical formula of tetrakis(dimethylamide)hafnium is $Hf[N(CH_3)_2]_4$. In addition, as another material liquid, there are tetrakis(ethylmethylamide)hafnium and the like.

For example, in the case where an aluminum oxide film is formed with a deposition apparatus employing ALD, two kinds of gases, i.e., a source gas which is obtained by vaporizing liquid containing a solvent and an aluminum precursor compound (trimethylaluminum (TMA) or the like) and $H_2O$ as an oxidizer are used. Note that the chemical formula of trimethylaluminum is $Al(CH_3)_3$. In addition, as another material liquid, there are tris(dimethylamide)aluminum, triisobutylaluminum, aluminum tris(2,2,6,6-tetramethyl-3,5-heptanedionate), and the like.

For example, in the case where a silicon oxide film is formed with a deposition apparatus employing ALD, hexachlorodisilane is adsorbed on a surface where a film is to be formed, chlorine contained in the adsorbate is removed, and radicals of an oxidation gas ($O_2$ or dinitrogen monoxide) are supplied to react with the adsorbate.

For example, in the case where a tungsten film is formed with a deposition apparatus employing ALD, a $WF_6$ gas and a $B_2H_6$ gas are alternately introduced to form an initial tungsten film, and then a $WF_6$ gas and an $H_2$ gas are alternately introduced, so that a tungsten film is formed. Note that an $SiH_4$ gas may be used instead of a $B_2H_6$ gas.

For example, in the case where an oxide semiconductor film, e.g., an In—Ga—Zn—O film, is formed with a deposition apparatus employing ALD, an $In(CH_3)_3$ gas and an $O_3$ gas) are alternately introduced to form an In—O layer, and then a $Ga(CH_3)_3$ gas and an $O_3$ gas) are alternately introduced to form a GaO layer, and furthermore, a $Zn(CH_3)_2$ gas and an $O_3$ gas) are then alternately introduced to form a ZnO layer. Note that the order of these layers is not limited to this example. Furthermore, a mixed compound layer such as an In—Ga—O layer, an In—Zn—O layer, or a Ga—Zn—O layer may be formed by using these gases. Note that although an $H_2O$ gas which is obtained by bubbling water with an inert gas such as Ar may be used instead of an $O_3$ gas), it is preferable to use an $O_3$ gas), which does not contain H. Furthermore, instead of an $In(CH_3)_3$ gas, an $In(C_2H_5)_3$ gas may be used. In addition, instead of a $Ga(CH_3)_3$ gas, a $Ga(C_2H_5)_3$ gas may be used. Furthermore, instead of an $In(CH_3)_3$ gas, an $In(C_2H_5)_3$ gas may be used. Furthermore, a $Zn(CH_3)_2$ gas may be used.

This embodiment can be implemented in an appropriate combination with the structures described in the other embodiments.

Embodiment 3

The peripheral circuit and the pixel circuit can be provided with, as appropriate, a logic circuit such as an OR circuit, an AND circuit, a NAND circuit, a NOR circuit, and the like, an inverter circuit, a buffer circuit, a shift register circuit, a flip-flop circuit, an encoder circuit, a decoder circuit, an amplifier circuit, an analog switch circuit, an integrator circuit, a differentiation circuit, a memory element, and the like.

In this embodiment, an example of a CMOS circuit that can be used for the peripheral circuit and the pixel circuit, or the like will be described with reference to FIG. 15(A) to FIG. 15(E). In the circuit diagrams illustrated in FIG. 15(A) to FIG. 15(E), the indication of "OS" is given beside a circuit symbol of a transistor using an oxide semiconductor in order to clearly demonstrate that it is a transistor using an oxide semiconductor.

Figure 15A:
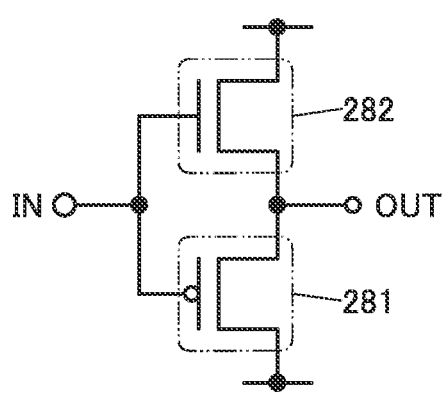
FIGS. 15A-15E Views illustrating examples of a circuit configuration.

The CMOS circuit shown in FIG. 15(A) illustrates a configuration example of what is called an inverter circuit in which the p-channel transistor 281 and the n-channel transistor 282 are connected in series and in which gates thereof are connected.

Figure 15B:
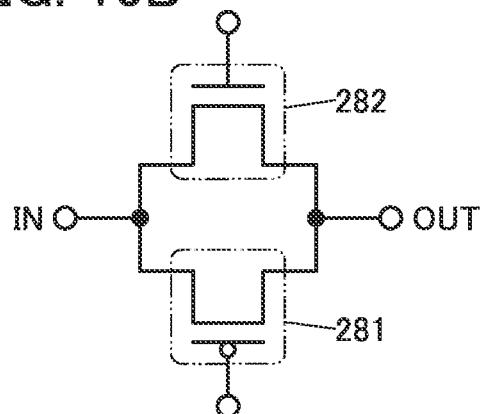

The CMOS circuit shown in FIG. 15(B) illustrates a configuration example of what is called an analog switch circuit in which the p-channel transistor 281 and the n-channel transistor 282 are connected in parallel.

Figure 15C:
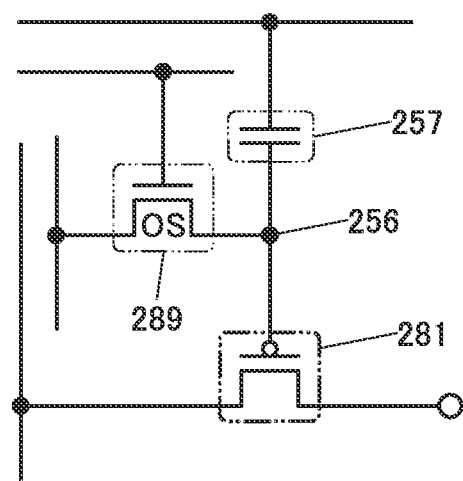

The circuit shown in FIG. 15(C) illustrates a configuration example of what is called a memory element in which one of a source and a drain of the n-channel transistor 289 is connected to a gate of the p-channel transistor and one electrode of a capacitor 257. In addition, the circuit shown in FIG. 15(D) illustrates a configuration example of what is called a memory element in which one of a source and a drain of the n-channel transistor 289 is connected to one electrode of the capacitor 257.

Figure 15D:
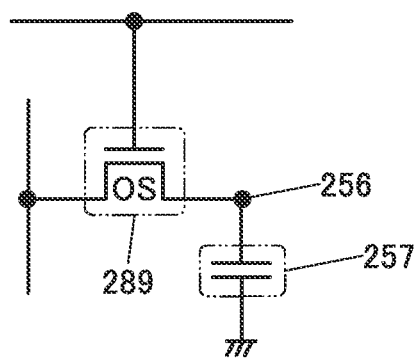

In the circuits shown in FIG. 15(C) and FIG. 15(D), an electric charge injected from the other of the source and the drain of the transistor 289 can be stored in a node 256. A transistor using an oxide semiconductor is used for the transistor 289, which enables an electric charge to be stored in the node 256 for a long period. In addition, the transistor 281 may also be a transistor using an oxide semiconductor for a semiconductor layer in which a channel is formed.

Figure 15E:
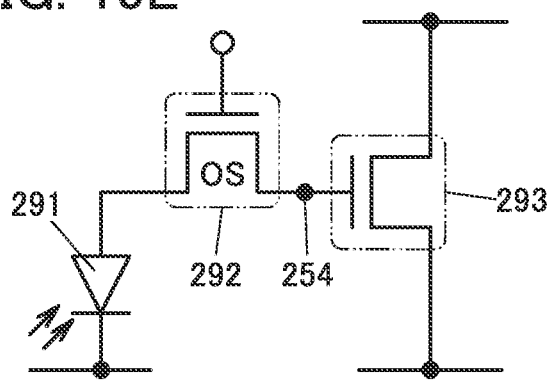

The circuit shown in FIG. 15(E) illustrates a configuration example of an optical sensor. In FIG. 15(E), one of a source and a drain of a transistor 292 using an oxide semiconductor for a semiconductor layer in which a channel is formed is electrically connected to a photodiode 291, and the other of the source and the drain of the transistor 292 is electrically connected to a gate of a transistor 293 through a node 254. The transistor 292 using an oxide semiconductor for a semiconductor layer in which a channel is formed can have the extremely small amount of off-state current; thus, the potential of the node 254 that is determined depending on the amount of received light hardly changes. Thus, an imaging device which is less likely to be affected by noise can be achieved. Furthermore, an imaging device with high linearity can be achieved.

Figure 16A:
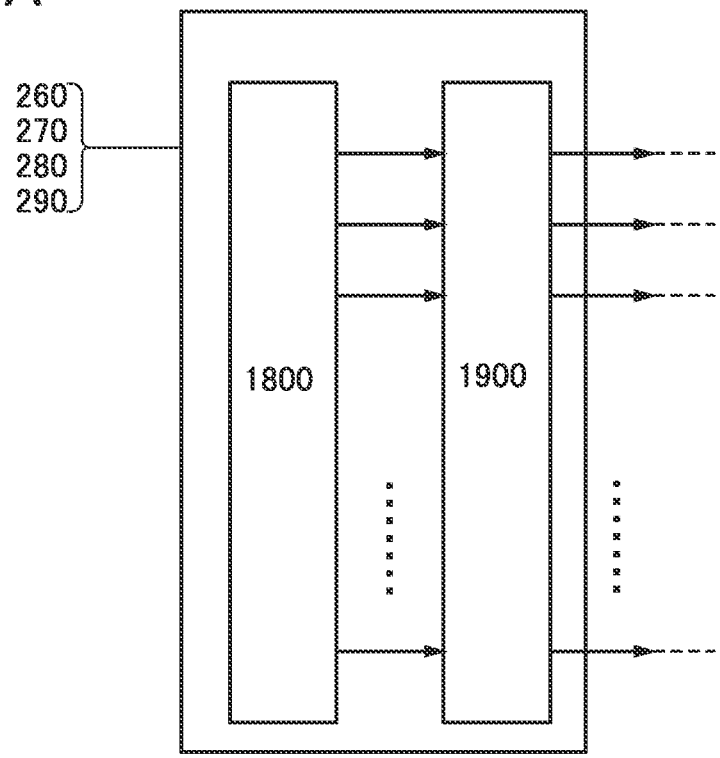
FIGS. 16A-16B Views illustrating examples of a circuit configuration.
Figure 16B:
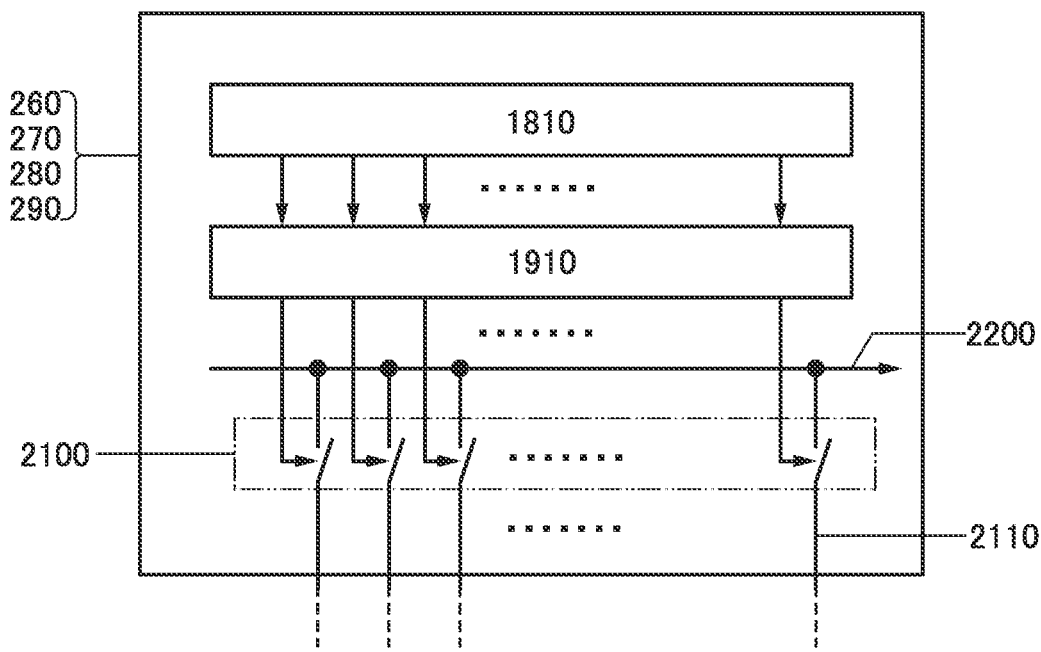

In addition, for the peripheral circuit, a circuit in which a shift register circuit 1800 and a buffer circuit 1900 are combined, shown in FIG. 16(A), may be provided. Alternatively, for the peripheral circuit, a circuit in which a shift register circuit 1810, a buffer circuit 1910, and an analog switch circuit 2100 are combined, as shown in FIG. 16(B), may be provided. Vertical output lines 2110 are selected by the analog switch circuit 2100, and output signals are output to an output line 2200. The analog switch circuit 2100 can be sequentially selected by the shift register circuit 1810 and the buffer circuit 1910.

Figure 17A:
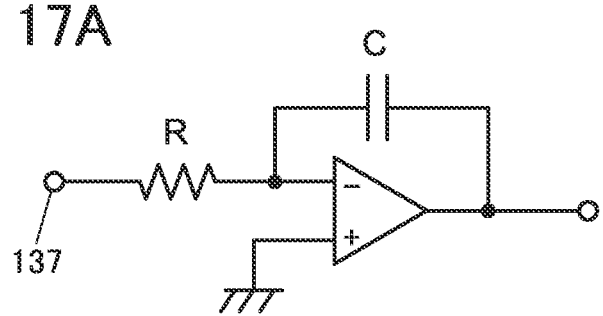
FIGS. 17A-17C Views illustrating examples of a circuit configuration.
Figure 17B:
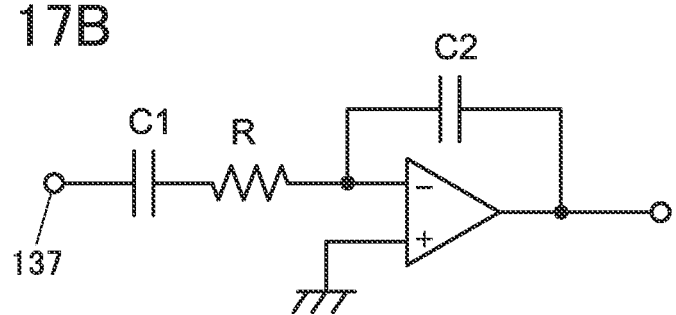
Figure 17C:
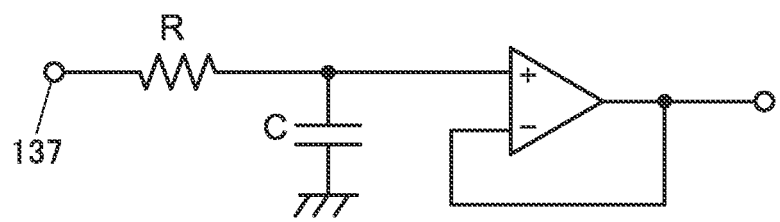

In addition, in the circuit diagram shown for the above embodiment, an integrator circuit as shown in FIG. 17(A), FIG. 17(B), or FIG. 17(C) may be connected to the wiring 137 (OUT). The circuit enables an S/N ratio of a reading signal to be increased, which makes it possible to detect weaker light. In other words, the sensitivity of the imaging device can be increased.

FIG. 17(A) is an integrator circuit using an operational amplifier circuit (also referred to as an OP-amp). An inverting input terminal of the operational amplifier circuit is connected to the wiring 137 through a resistor R. A non-inverting input terminal of the operational amplifier circuit is connected to a ground potential. An output terminal of the operational amplifier circuit is connected to the inverting input terminal of the operational amplifier circuit through a capacitor C.

FIG. 17(B) is an integrator circuit including an operational amplifier circuit having a configuration different from that in FIG. 17(A). An inverting input terminal of the operational amplifier circuit is connected to the wiring 137 (OUT) through the resistor R and a capacitor C1. A non-inverting input terminal of the operational amplifier circuit is connected to a ground potential. An output terminal of the operational amplifier circuit is connected to the inverting input terminal of the operational amplifier circuit through a capacitor C2.

FIG. 17(C) is an integrator circuit using an operational amplifier circuit having a configuration different from those in FIG. 17(A) and FIG. 17(B). A non-inverting input terminal of the operational amplifier circuit is connected to the wiring 137 through the resistor R. An inverting input terminal of the operational amplifier circuit is connected to an inverting input terminal of the operational amplifier circuit. Note that the resistor R and the capacitor C constitute a CR integrator circuit. Furthermore, the operational amplifier circuit constitutes a unity gain buffer.

This embodiment can be implemented in an appropriate combination with the structures described in the other embodiments.

Embodiment 4

In this embodiment, a structure example of a transistor that can be used in place of the transistor described in the above embodiments will be described with reference to FIG. 18 to FIG. 22.

<Bottom-Gate Transistor>

A transistor 410 illustrated in FIG. 18(A1) is a channel-protective transistor that is a type of bottom-gate transistor. The transistor 410 includes an electrode 246 that can function as a gate electrode over the insulating layer 109, and includes the semiconductor layer 242 over the electrode 246 with the insulating layer 117 positioned therebetween. The electrode 246 can be formed using a material and a method similar to those of the wiring 121.

In addition, the transistor 410 includes an insulating layer 209 that can function as a channel protective layer over a channel formation region in the semiconductor layer 242. The insulating layer 209 can be formed using a material and a method similar to those of the insulating layer 117. Part of an electrode 244 and part of an electrode 249 are formed over the insulating layer 209.

With the insulating layer 209 provided over the channel formation region, the semiconductor layer 242 can be prevented from being exposed at the time of forming the electrode 244 and the electrode 249. Thus, the semiconductor layer 242 can be prevented from being reduced in thickness at the time of forming the electrode 244 and the electrode 249. According to one embodiment of the present invention, a transistor with favorable electrical characteristics can be achieved.

A transistor 411 shown in FIG. 18(A2) is different from the transistor 410 in that an electrode 213 that can function as a back gate electrode is included over an insulating layer 118. The electrode 213 can be formed using a material and a method similar to those of the wiring 121.

In general, the back gate electrode is formed using a conductive layer and positioned so that the channel formation region of the semiconductor layer is put between the gate electrode and the back gate electrode. Thus, the back gate electrode can function in a manner similar to that of the gate electrode. The potential of the back gate electrode may be the same as that of the gate electrode or may be a GND potential or a predetermined potential. Furthermore, by changing the potential of the back gate electrode independently of that of the gate electrode, the threshold voltage of the transistor can be changed.

The electrode 246 and the electrode 213 can both function as gate electrodes. Thus, the insulating layer 117, the insulating layer 209, and the insulating layer 118 can function as gate insulating layers.

Note that in the case where one of the electrode 246 and the electrode 213 is referred to as a "gate electrode," the other is referred to as a "back gate electrode" in some cases. For example, in the transistor 411, in the case where the electrode 213 is referred to as a "gate electrode," the electrode 246 may sometimes be referred to as a "back gate electrode," In addition, in the case where the electrode 213 is used as a "gate electrode," the transistor 411 can be considered as a kind of top-gate transistor. Furthermore, in some cases, one of the electrode 246 and the electrode 213 is referred to as a "first gate electrode," and the other is referred to as a "second gate electrode."

By providing the electrode 246 and the electrode 213 with the semiconductor layer 242 positioned therebetween and furthermore setting the potentials of the electrode 246 and the electrode 213 to be the same, a region of the semiconductor layer 242 through which carriers flow is enlarged in the film thickness direction; thus, the number of transferred carriers is increased. As a result, as the on-state current of the transistor 411 is increased, the field-effect mobility is increased.

Therefore, the transistor 411 is a transistor having large on-state current for the area occupied thereby. That is, the area occupied by the transistor 411 can be small for required on-state current. According to one embodiment of the present invention, the area occupied by a transistor can be reduced. Therefore, according to one embodiment of the present invention, a semiconductor device having a high degree of integration can be achieved.

Furthermore, the gate electrode and the back gate electrode are formed using conductive layers and thus have a function of preventing an electric field generated outside the transistor from influencing the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

Furthermore, since the electrode 246 and the electrode 213 each have a function of blocking an electric field from the outside, electric charges of charged particles and the like generated on the insulating layer 109 side or above the electrode 213 do not influence the channel formation region in the semiconductor layer 242. As a result, degradation in a stress test (e.g., a −GBT (Gate Bias Temperature) stress test in which negative electric charges are applied to a gate) can be reduced, and changes in the rising voltages of on-state current at different drain voltages can be reduced. Note that this effect can be produced when the electrode 246 and the electrode 213 have the same potential or different potentials.

Note that the BT stress test is one kind of accelerated test and can evaluate, in a short time, a change caused by long-term use (i.e., a change over time) in characteristics of transistors. In particular, the amount of change in threshold voltage of the transistor between before and after the BT stress test is an important indicator when examining its reliability. As the amount of change in the threshold voltage between before and after the BT stress test is smaller, the transistor has higher reliability.

In addition, by including the electrode 246 and the electrode 213 and setting the potentials of the electrode 246 and the electrode 213 to be the same, the amount of change in threshold voltage is reduced. Accordingly, variation in electrical characteristics among a plurality of transistors is also reduced at the same time.

In addition, the transistor including the back gate electrode has a smaller change in threshold voltage by a +GBT stress test in which positive electric charges are applied to a gate than a transistor including no back gate electrode.

In addition, in the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

According to one embodiment of the present invention, a transistor with high reliability can be achieved. Moreover, a semiconductor device with high reliability can be achieved.

A transistor 420 illustrated in FIG. 18(B1) is a channel-protective transistor that is a type of bottom-gate transistor. The transistor 420 has substantially the same structure as the transistor 410 but is different in that the insulating layer 209 covers the semiconductor layer 242. Furthermore, the semiconductor layer 242 is electrically connected to the electrode 244 in the opening which is formed by selectively removing part of the insulating layer 209 overlapping the semiconductor layer 242. Furthermore, the semiconductor layer 242 is electrically connected to the electrode 249 in the opening which is formed by selectively removing part of the insulating layer 209 overlapping the semiconductor layer 242. A region of the insulating layer 209 which overlaps the channel formation region can function as a channel protective layer.

A transistor 421 shown in FIG. 18(B2) is different from the transistor 420 in that the electrode 213 that can function as a back gate electrode is provided over the insulating layer 118.

With the insulating layer 209 provided, the semiconductor layer 242 can be prevented from being exposed at the time of forming the electrode 244 and the electrode 249. Thus, the semiconductor layer 242 can be prevented from being reduced in thickness at the time of forming the electrode 244 and the electrode 249.

In addition, the distance between the electrode 244 and the electrode 246 and the distance between the electrode 249 and the electrode 246 in the transistor 420 and the transistor 421 are longer than those in the transistor 410 and the transistor 411. Thus, the parasitic capacitance generated between the electrode 244 and the electrode 246 can be reduced. The parasitic capacitance generated between the electrode 249 and the electrode 246 can also be reduced. According to one embodiment of the present invention, a transistor with favorable electrical characteristics can be achieved.

<Top-Gate Transistor>

A transistor 430 illustrated in FIG. 19(A1) is a type of top-gate transistor. The transistor 430 includes the semiconductor layer 242 over the insulating layer 109; the electrode 244 in contact with part of the semiconductor layer 242 and the electrode 249 in contact with part of the semiconductor layer 242, over the semiconductor layer 242 and the insulating layer 109; the insulating layer 117 over the semiconductor layer 242, the electrode 244, and the electrode 249; and the electrode 246 over the insulating layer 117.

Since, in the transistor 430, neither the electrode 246 and the electrode 244 nor the electrode 246 and the electrode 249 overlap, the parasitic capacitance generated between the electrode 246 and the electrode 244 and the parasitic capacitance generated between the electrode 246 and the electrode 249 can be reduced. In addition, after the electrode 246 is formed, an impurity element 255 is introduced into the semiconductor layer 242 using the electrode 246 as a mask, so that an impurity region can be formed in the semiconductor layer 242 in a self-aligned (self-alignment) manner (see FIG. 19(A3)). According to one embodiment of the present invention, a transistor with favorable electrical characteristics can be achieved.

Note that the introduction of the impurity element 255 can be performed with an ion implantation apparatus, an ion doping apparatus, or a plasma treatment apparatus.

As the impurity element 255, for example, at least one kind of element of Group 13 elements and Group 15 elements can be used. In addition, in the case where an oxide semiconductor is used for the semiconductor layer 242, it is also possible to use at least one kind of element of a rare gas, hydrogen, and nitrogen as the impurity element 255.

A transistor 431 shown in FIG. 19(A2) is different from the transistor 430 in that the electrode 213 and the insulating layer 217 are included. The transistor 431 includes the electrode 213 formed over the insulating layer 109 and the insulating layer 217 formed over the electrode 213. As described above, the electrode 213 can function as a back gate electrode. Thus, the insulating layer 217 can function as a gate insulating layer. The insulating layer 217 can be formed using a material and a method similar to those of the insulating layer 205.

The transistor 431 as well as the transistor 411 is a transistor having large on-state current for the area occupied thereby. That is, the area occupied by the transistor 431 can be small for required on-state current. According to one embodiment of the present invention, the area occupied by a transistor can be reduced. Therefore, according to one embodiment of the present invention, a semiconductor device having a high degree of integration can be achieved.

A transistor 440 illustrated in FIG. 19(B1) is a type of top-gate transistor. The transistor 440 is different from the transistor 430 in that the semiconductor layer 242 is formed after the electrode 244 and the electrode 249 are formed. In addition, a transistor 441 illustrated in FIG. 19(B2) is different from the transistor 440 in that the electrode 213 and the insulating layer 217 are included. In the transistor 440 and the transistor 441, part of the semiconductor layer 242 is formed over the electrode 244 and another part of the semiconductor layer 242 is formed over the electrode 249.

The transistor 441 as well as the transistor 411 is a transistor having large on-state current for the area occupied thereby. That is, the area occupied by the transistor 441 can be small for required on-state current. According to one embodiment of the present invention, the area occupied by a transistor can be reduced. Therefore, according to one embodiment of the present invention, a semiconductor device having a high degree of integration can be achieved.

Also in the transistor 440 and the transistor 441, after the electrode 246 is formed, the impurity element 255 is introduced into the semiconductor layer 242 using the electrode 246 as a mask, so that an impurity region can be formed in the semiconductor layer 242 in a self-aligned manner. According to one embodiment of the present invention, a transistor with favorable electrical characteristics can be achieved. Furthermore, according to one embodiment of the present invention, a semiconductor device having a high degree of integration can be achieved.

<S-Channel Transistor>

Figure 20A:
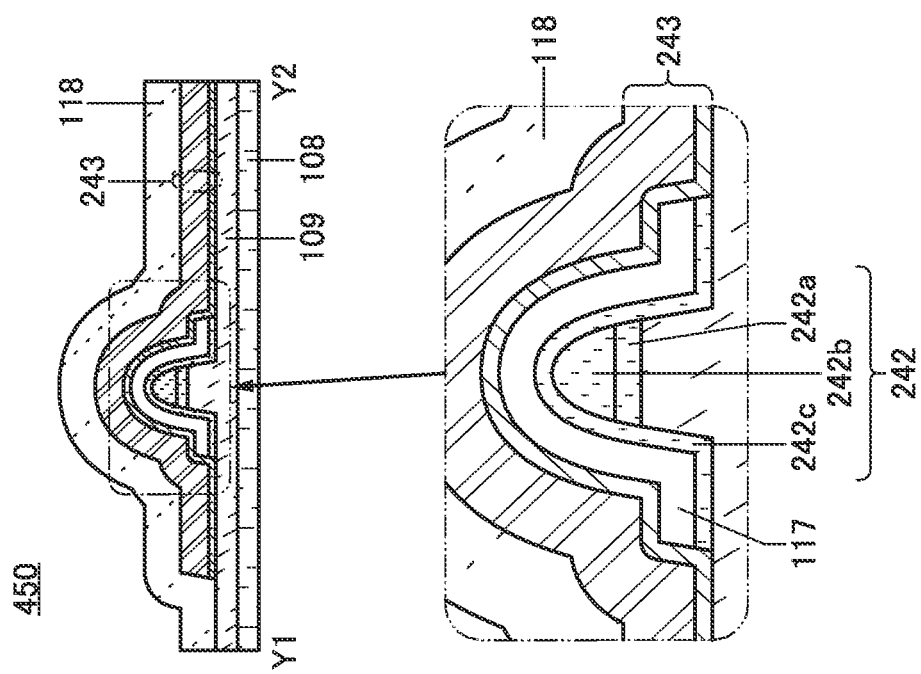
FIGS. 20A-20C Views illustrating an embodiment of a transistor.
Figure 20B:
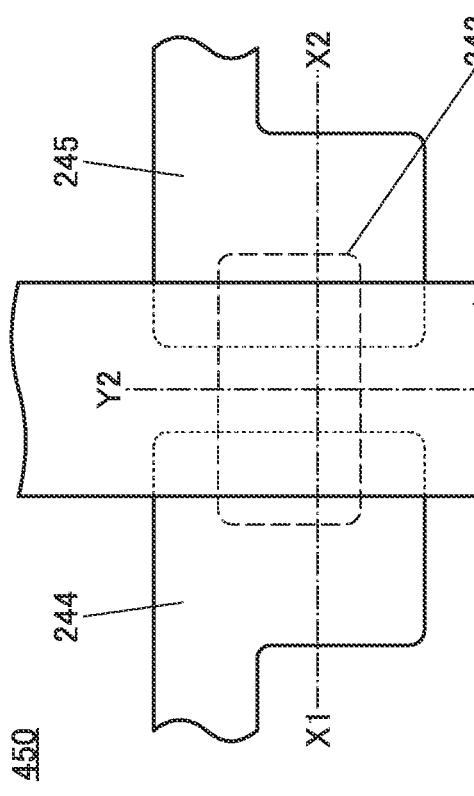
Figure 20C:
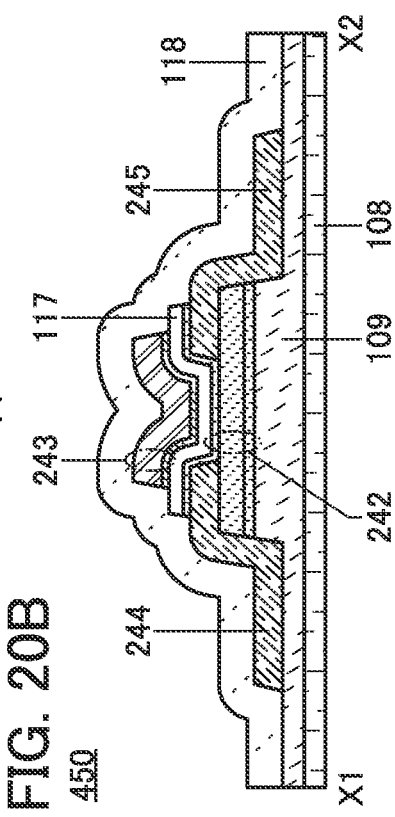

A transistor 450 illustrated in FIG. 20 has a structure in which a top surface and side surface of the semiconductor layer 242b are covered with the semiconductor layer 242c. FIG. 20(A) is the top view of the transistor 450. FIG. 20(B) is a cross-sectional view (a cross-sectional view in the channel length direction) taken along dashed-dotted line X1-X2 in FIG. 20(A). FIG. 20(C) is a cross-sectional view (a cross-sectional view in the channel width direction) taken along dashed-dotted line Y1-Y2 in FIG. 20(A).

With the semiconductor layer 242b provided on the projection formed on the insulating layer 109, the side surface of the semiconductor layer 242b can be totally covered with the electrode 243. That is, the transistor 450 has a structure in which the semiconductor layer 242b can be electrically surrounded by electric field of the electrode 243. In this way, the structure of a transistor in which the semiconductor layer in which the channel is formed is electrically surrounded by the electric field of the conductive film is called a surrounded channel (s-channel) structure. In addition, a transistor having an s-channel structure is referred to as an "s-channel type transistor" or "s-channel transistor."

In an s-channel structure, a channel is formed in the whole (bulk) of the semiconductor layer 242b in some cases. In the s-channel structure, the drain current of the transistor can be increased, so that a larger amount of on-state current can be obtained. Furthermore, an entire region of the channel formation region formed in the semiconductor layer 242b can be depleted by the electric field of the electrode 243. Accordingly, off-state current of the transistor with an s-channel structure can be further reduced.

Note that the projecting portion of the insulating layer 109 is increased in height, and the channel width is shortened, so that the effects of the s-channel structure to increase the on-state current and reduce the off-state current can be further enhanced. In addition, part of the semiconductor layer 242a exposed in the formation of the semiconductor layer 242b may be removed. In this case, the side surfaces of the semiconductor layer 242a and the semiconductor layer 242b are aligned in some cases.

In addition, as in a transistor 451 illustrated in FIG. 21, the electrode 213 may be provided below the semiconductor layer 242 with an insulating layer positioned therebetween. FIG. 21(A) is a top view of the transistor 451. FIG. 21(B) is a cross-sectional view taken along dashed-dotted line X1-X2 in FIG. 21(A). FIG. 21(C) is a cross-sectional view taken along dashed-dotted line Y1-Y2 in FIG. 21(A).

Figure 22C:
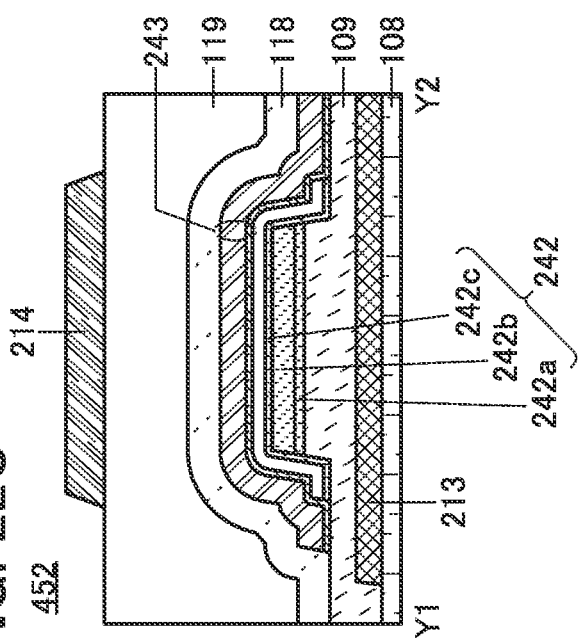
FIGS. 22A-22C Views illustrating an embodiment of a transistor.
Figure 22A:
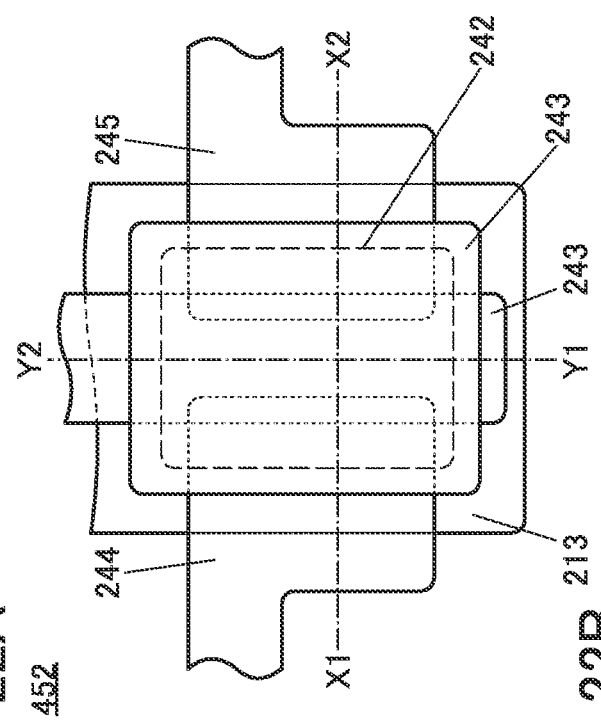
Figure 22B:
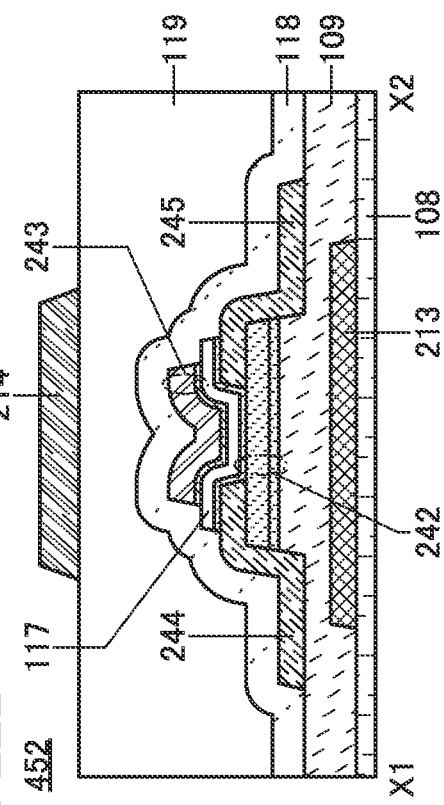

In addition, as in a transistor 452 illustrated in FIG. 22, a layer 214 may be provided over the electrode 243. FIG. 22(A) is a top view of the transistor 452. FIG. 22(B) is a cross-sectional view taken along dashed-dotted line X1-X2 in FIG. 22(A). FIG. 22(C) is a cross-sectional view taken along dashed-dotted line Y1-Y2 in FIG. 22(A).

The layer 214 is provided over the insulating layer 119 in FIG. 22, but may be provided over the insulating layer 118. The layer 214 is formed using a material having a light-blocking property, so that change in characteristics, decrease in reliability, or the like of the transistor, which is caused by light irradiation, can be prevented. Note that when the layer 214 is formed at least larger than the semiconductor layer 242b such that the semiconductor layer 242b is covered with the layer 214, the above effects can be improved. The layer 214 can be formed using an organic material, an inorganic material, or a metal material. Moreover, in the case where the layer 214 is formed using a conductive material, the layer 214 may be supplied with voltage or may be set to an electrically-floating (floating) state.

Furthermore, the electrode 245 becomes a floating state when the transistor 134 is in an off state, and the capacitor 135 described in the above embodiments becomes easily affected by an ambient potential change such as noise or the like. In other words, when the transistor 134 is in an off state, the potential of the electrode 245 that can function as the node 152 may change owing to the influence of an ambient electric field such as noise or the like.

Figure 23:
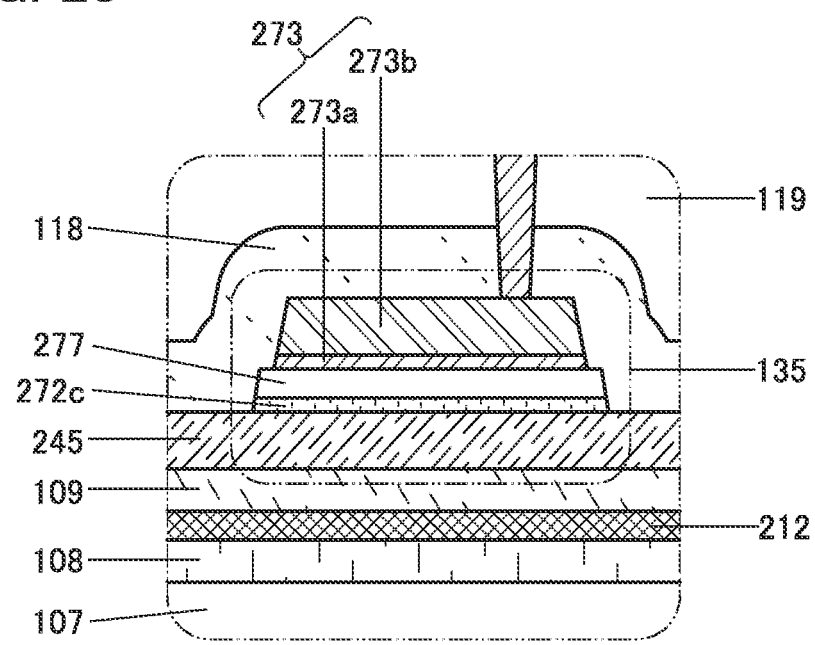
FIG. 23 A view illustrating one embodiment of a capacitor.

As illustrated in a cross-sectional view of FIG. 23, the provision of an electrode 212 below the electrode 245 with an insulating layer positioned therebetween can suppress a change in potential of the electrode 245 that can function as the node 152. The electrode 212 can be formed using a material and a method similar to those of the wiring 121.

This embodiment can be implemented in an appropriate combination with the structures described in the other embodiments.

Embodiment 5

In this embodiment, an example of an electronic device using the imaging device related to one embodiment of the present invention will be described.

As electronic devices using the imaging device related to one embodiment of the present invention, display devices such as televisions, monitors, and the like, lighting devices, desktop or laptop personal computers, word processors, image reproduction devices which reproduce still images or moving images stored in recording media such as DVDs (Digital Versatile Disc) and the like, portable CD players, radios, tape recorders, headphone stereos, stereos, navigation systems, table clocks, wall clocks, cordless phone handsets, transceivers, mobile phones, car phones, portable game consoles, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens and the like, electric rice cookers, electric washing machines, electric vacuum cleaners, water heaters, electric fans, hair dryers, air-conditioning systems such as air conditioners, humidifiers, dehumidifiers, and the like, dishwashers, dish dryers, clothes dryers, futon dryers, electric refrigerators, electric freezers, electric refrigerator-freezers, freezers for preserving DNA, flashlights, tools such as chain saws and the like, smoke detectors, medical equipment such as dialyzers and the like, facsimiles, printers, multifunction printers, automated teller machines (ATM), and vending machines can be given. Furthermore, industrial equipment such as guide lights, traffic lights, belt conveyors, elevators, escalators, industrial robots, power storage systems, and power storage devices for leveling the amount of power supply and smart grid can be given. In addition, moving objects and the like driven by engines using fuel or electric motors using electric power from a nonaqueous secondary battery are supposed to be also included in the category of electronic devices. As the above moving objects, electric vehicles (EV), hybrid electric vehicles (HEV) which include both an internal-combustion engine and a motor, plug-in hybrid electric vehicles (PHEV), tracked vehicles in which caterpillar tracks are substituted for wheels of these, motorized bicycles including motor-assisted bicycles, motorcycles, electric wheelchairs, golf carts, boats, small or large ships, submarines, helicopters, aircrafts, rockets, artificial satellites, space probes, planetary probes, and spacecrafts can be given.

Figure 24A:
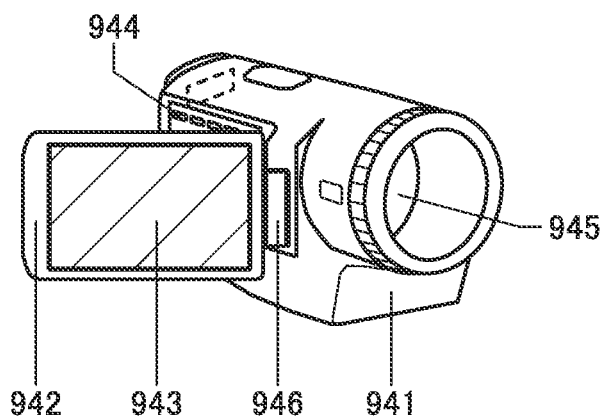
FIGS. 24A-24F Views illustrating electronic devices related to one embodiment of the present invention.

FIG. 24(A) is a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. In addition, the first housing 941 and the second housing 942 are connected with the joint 946, and the angle between the first housing 941 and the second housing 942 can be changed with the joint 946. Images on the display portion 943 may be switched in accordance with the angle at the joint 946 between the first housing 941 and the second housing 942. The imaging device of one embodiment of the present invention can be provided in a focus position of the lens 945.

Figure 24B:
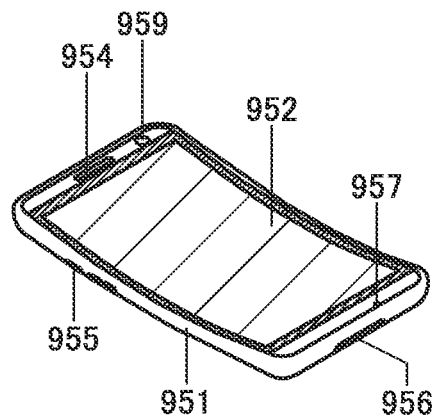

FIG. 24(B) is a mobile phone, which includes a display portion 952, a microphone 957, a speaker 954, a camera 959, an input/output terminal 956, an operation button 955, and the like in a housing 951. The imaging device of one embodiment of the present invention can be used for the camera 959.

Figure 24C:
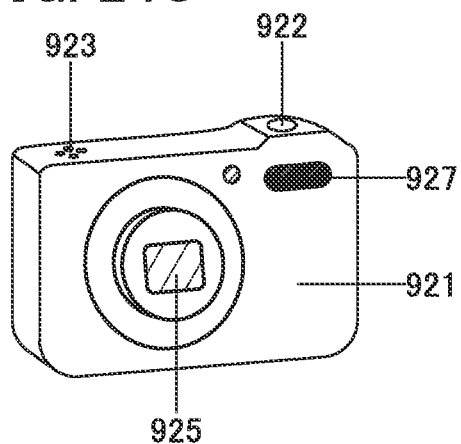

FIG. 24(C) is a digital camera, which includes a housing 921, a shutter button 922, a microphone 923, a light-emitting portion 927, a lens 925, and the like. The imaging device of one embodiment of the present invention can be provided in a focus position of the lens 925.

Figure 24D:
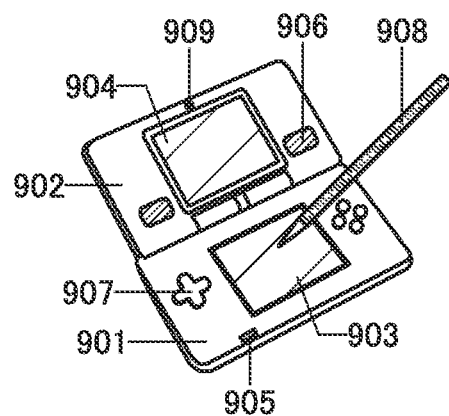

FIG. 24(D) is a portable game console, which includes a housing 901, a housing 902, a display portion 903, a display portion 904, a microphone 905, a speaker 906, an operation key 907, a stylus 908, a camera 909, and the like. Note that although the portable game console in FIG. 23(A) has the two display portion 903 and display portion 904, the number of display portions included in a portable game console is not limited to this. The imaging device of one embodiment of the present invention can be used for the camera 909.

Figure 24E:
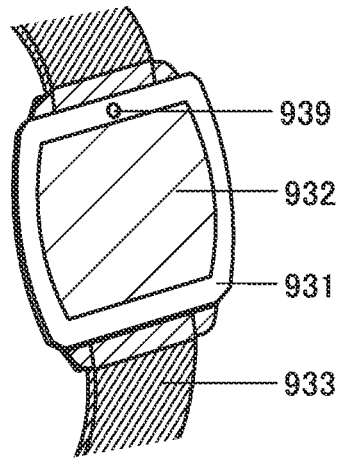

FIG. 24(E) is a wrist-watch-type information terminal, which includes a housing 931, a display portion 932, a wristband 933, a camera 939, and the like. The display portion 932 may be a touch panel. The imaging device of one embodiment of the present invention can be used for the camera 909.

Figure 24F:
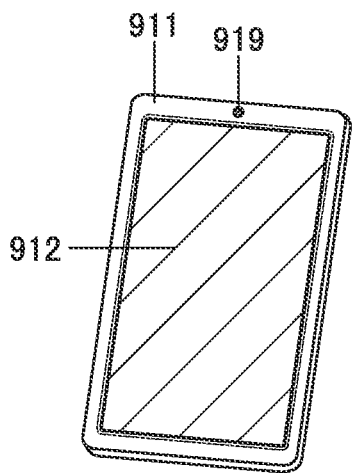

FIG. 24(F) is a portable data terminal, which includes a first housing 911, a display portion 912, a camera 919, and the like. A touch panel function of the display portion 912 enables input and output of information. The imaging device of one embodiment of the present invention can be used for the camera 909.

Note that, needless to say, they are not limited to the above-described electronic devices as long as the imaging device of one embodiment of the present invention is included.

This embodiment can be implemented in an appropriate combination with the structures described in the other embodiments.

REFERENCE NUMERALS

100: imaging device, 101: substrate, 102: insulating layer, 103: insulating layer, 104: insulating layer, 105: insulating layer, 106: contact plug, 107: insulating layer, 108: insulating layer, 109: insulating layer, 110: pixel portion, 111: pixel, 112: pixel driver circuit, 113: pixel, 115: insulating layer, 116: insulating layer, 117: insulating layer, 118: insulating layer, 119: insulating layer, 121: wiring, 122: wiring, 123: wiring, 124: wiring, 125: wiring, 126: wiring, 127: wiring, 128: wiring, 129: wiring, 131: transistor, 132: transistor, 133: transistor, 134: transistor, 135: capacitor, 136: photoelectric conversion element, 137: wiring, 141: wiring, 142: wiring, 143: wiring, 144: wiring, 145: wiring, 151: node, 152: node, 177: insulating layer, 205: insulating layer, 209: insulating layer, 212: electrode, 213: electrode, 214: layer, 217: insulating layer, 221: p-type semiconductor, 222: i-type semiconductor, 223: n-type semiconductor, 224: opening, 225: opening, 241: transistor, 242: semiconductor layer, 243: electrode, 244: electrode, 245: electrode, 246: electrode, 249: electrode, 251: pixel region, 252: peripheral circuit region, 254: node, 255: impurity element, 256: node, 257: capacitor, 260: circuit, 261: signal processing circuit, 262: column driver circuit, 263: output circuit, 264: circuit, 266: wiring, 267: wiring, 268: wiring, 269: wiring, 270: circuit, 273: electrode, 277: insulating layer, 280: circuit, 281: transistor, 282: transistor, 283: i-type semiconductor, 284: low-concentration p-type impurity region, 285: p-type semiconductor, 286: insulating layer, 287: electrode, 288: sidewall, 289: transistor, 290: circuit, 291: photodiode, 292: transistor, 293: transistor, 294: low-concentration n-type impurity region, 295: n-type semiconductor, 382: Ec, 386: Ec, 390: trap states, 410: transistor, 411: transistor, 420: transistor, 421: transistor, 430: transistor, 431: transistor, 440: transistor, 441: transistor, 450: transistor, 451: transistor, 452: transistor, 600: lens, 602: filter, 604: wiring layer, 660: light, 901: housing, 902: housing, 903: display portion, 904: display portion, 905: microphone, 906: speaker, 907: operation key, 908: stylus, 909: camera, 911: housing, 912: display portion, 919: camera, 921: housing, 922: shutter button, 923: microphone, 925: lens, 927: light-emitting portion, 931: housing, 932: display portion, 933: wristband, 939: camera, 941: housing, 942: housing, 943: display portion, 944: operation key. 945: lens, 946: joint, 951: housing, 952: display portion, 954: speaker, 955: button, 956: input/output terminal, 957: microphone, 959: camera, 1800: shift register circuit, 1810: shift register circuit, 1900: buffer circuit, 1910: buffer circuit, 2100: analog switch circuit, 2110: vertical output line, 2200: output line, 108c: semiconductor layer, 111B: pixel, 111G: pixel, 111R: pixel, 242a: semiconductor layer, 242b: semiconductor layer, 242c: semiconductor layer, 243a: electrode, 243b: electrode, 264a: comparator, 264b: counter circuit, 272c: semiconductor layer, 383a: Ec, 383b: Ec, 383c: Ec, 602B: filter, 602G: filter, 602R: filter

What is claimed is:
1. A semiconductor device comprising:
a photoelectric conversion element;
a first transistor, a second transistor, a third transistor, and a fourth transistor;
a first wiring electrically connected to a gate of the first transistor;
a second wiring electrically connected to a gate of the second transistor;
a third wiring electrically connected to a gate of the fourth transistor; and
a fourth wiring electrically connected to the photoelectric conversion element,
wherein one of a source and a drain of the first transistor is electrically connected to the photoelectric conversion element,
wherein the other of the source and the drain of the first transistor is electrically connected to one of a source and a drain of the second transistor and a gate of the third transistor,
wherein one of a source and a drain of the third transistor is electrically connected to one of a source and a drain of the fourth transistor,
wherein, in a plan view, a conductive layer functioning as the fourth wiring is provided in a net shape,
wherein, in the plan view, the conductive layer functioning as the fourth wiring surrounds the first transistor, the second transistor, the third transistor, and the fourth transistor, and
wherein, in the plan view, the conductive layer functioning as the fourth wiring does not overlap with a semiconductor layer of each of the first transistor, the second transistor, the third transistor, and the fourth transistor.
2. The semiconductor device according to claim 1, wherein each of the first transistor, the second transistor, the third transistor, and the fourth transistor comprises a channel formation region comprising an oxide semiconductor.

3. A semiconductor device comprising:
a photoelectric conversion element;
a first transistor, a second transistor, a third transistor, and a fourth transistor;
a first wiring electrically connected to a gate of the first transistor;
a second wiring electrically connected to a gate of the second transistor;
a third wiring electrically connected to a gate of the fourth transistor;
a fourth wiring electrically connected to the photoelectric conversion element; and
a capacitor,
wherein one of a source and a drain of the first transistor is electrically connected to the photoelectric conversion element,
wherein the other of the source and the drain of the first transistor is electrically connected to one of a source and a drain of the second transistor and a gate of the third transistor,
wherein one of a source and a drain of the third transistor is electrically connected to one of a source and a drain of the fourth transistor,
wherein one electrode of the capacitor is electrically connected to the other of the source and the drain of the first transistor,
wherein, in a plan view, a conductive layer functioning as the fourth wiring is provided in a net shape,
wherein, in the plan view, the conductive layer functioning as the fourth wiring surrounds the first transistor, the second transistor, the third transistor, and the fourth transistor, and
wherein, in the plan view, the conductive layer functioning as the fourth wiring does not overlap with a semiconductor layer of each of the first transistor, the second transistor, the third transistor, and the fourth transistor.

4. The semiconductor device according to claim 3, wherein each of the first transistor, the second transistor, the third transistor, and the fourth transistor comprises a channel formation region comprising an oxide semiconductor.

* * * * *